(12) United States Patent
Shudo et al.

(10) Patent No.: US 12,429,764 B2
(45) Date of Patent: Sep. 30, 2025

(54) MEASUREMENT METHOD, IMPRINT APPARATUS, AND ARTICLE MANUFACTURING METHOD

(71) Applicant: CANON KABUSHIKI KAISHA, Tokyo (JP)

(72) Inventors: Shinichi Shudo, Saitama (JP); Masataka Yasukawa, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 18/635,168

(22) Filed: Apr. 15, 2024

(65) Prior Publication Data

US 2024/0272545 A1    Aug. 15, 2024

Related U.S. Application Data

(62) Division of application No. 17/208,402, filed on Mar. 22, 2021, now Pat. No. 11,988,956.

(30) Foreign Application Priority Data

Apr. 10, 2020 (JP) ................................. 2020-071199

(51) Int. Cl.
*G03F 7/00* (2006.01)
*G01B 13/16* (2006.01)

(52) U.S. Cl.
CPC .......... *G03F 7/0002* (2013.01); *G01B 13/16* (2013.01)

(58) Field of Classification Search
CPC ..... G03F 7/0002; G03F 9/7034; G01B 13/16; G01B 11/0608; G01B 2210/42;

(Continued)

(56) References Cited

U.S. PATENT DOCUMENTS

2005/0105093 A1* 5/2005 Tokita ................... G03F 9/7034
356/401
2013/0241096 A1* 9/2013 Shudo .................... B82Y 40/00
264/40.5

(Continued)

FOREIGN PATENT DOCUMENTS

JP          2005108975 A     4/2005
JP          2006156508 A     6/2006

(Continued)

OTHER PUBLICATIONS

English translation of JP-2018022114-A by EPO. (Year: 2018).*

(Continued)

*Primary Examiner* — Xiao S Zhao
*Assistant Examiner* — Inja Song
(74) *Attorney, Agent, or Firm* — ROSSI, KIMMS & McDOWELL LLP

(57) ABSTRACT

The present invention provides a measurement method including while driving a measurement target region of a surface of a substrate in a first direction with respect to a measurement unit, obtaining first measurement information indicating a height of the measurement target region in each of a plurality of first measurement lines parallel to the first direction and different from each other by measuring each measurement line by the measurement unit, and while driving the measurement target region with respect to the measurement unit in a second direction crossing all of the plurality of first measurement lines, obtaining second measurement information indicating a height of the measurement target region in one second measurement line parallel to the second direction by measuring the second measurement line by the measurement unit.

10 Claims, 13 Drawing Sheets

(58) Field of Classification Search
CPC ............... G01B 2210/48; G01B 21/045; G01B 5/0009; G01B 21/08; G01B 21/04; G01B 11/24–306; G01B 17/02–08; G01B 21/16–32; B01B 15/02
See application file for complete search history.

(56) References Cited

U.S. PATENT DOCUMENTS

| | | | | |
|---|---|---|---|---|
| 2016/0193759 A1* | 7/2016 | Hattori | ............... | B29C 43/58 |
| | | | | 425/141 |
| 2017/0246657 A1* | 8/2017 | Tamura | ............... | B05D 3/12 |
| 2019/0354009 A1 | 11/2019 | Torii | | |

FOREIGN PATENT DOCUMENTS

| | | | | |
|---|---|---|---|---|
| JP | 2009295932 A | | 12/2009 | |
| JP | 2012132754 A | | 7/2012 | |
| JP | 2018022114 A | * | 2/2018 | ............ G01B 11/02 |
| JP | 2018074041 A | | 5/2018 | |
| KR | 1020190032486 A | | 3/2019 | |
| KR | 1020190132216 A | | 11/2019 | |
| WO | 2018061945 A1 | | 4/2018 | |

OTHER PUBLICATIONS

Office Action issued in U.S. Appl. No. 17/208,402 mailed Sep. 22, 2023.
Notice of Allowance issued in U.S. Appl. No. 17/208,402 mailed Feb. 2, 2024.

* cited by examiner

MEASUREMENT METHOD, IMPRINT APPARATUS, AND ARTICLE MANUFACTURING METHOD

BACKGROUND OF THE INVENTION

Field of the Invention

The present invention relates to a measurement method, an imprint apparatus, and an article manufacturing method.

Description of the Related Art

With an increasing demand for the miniaturization of semiconductor devices, in addition to a conventional photolithography technique, a microfabrication technique of molding an imprint material on a substrate using a mold to form, on the substrate, a miniature projection and groove pattern formed in the mold has received attention. Such a microfabrication technique is also called an imprint technique, and can form a fine pattern (structure) on the order of several nm on a substrate.

In the imprint technique, one example of the method of curing an imprint material is a photo-curing method. The photo-curing method forms a pattern of an imprint material on a substrate by irradiating the imprint material with light in a state in which the imprint material supplied to a shot region on the substrate is in contact with a mold, and releasing the mold from the cured imprint material.

In an imprint apparatus employing the imprint technique, upon bringing the mold into contact with the imprint material on the substrate, if the pattern surface of the mold and the surface of the substrate are not parallel to each other, the pattern formed on the substrate may be collapsed or insufficient filling of the imprint material to the mold may occur. Accordingly, it is necessary to obtain the height distribution of the pattern surface of the mold and the height distribution of the surface of the substrate before bringing the mold and the imprint material on the substrate into contact with each other. Note that obtaining the height distribution of the surface of the substrate is required not only in the imprint apparatus but also in an exposure apparatus that uses a projection optical system in which focus adjustment is necessary. The technique related to this is proposed in each of Japanese Patent Laid-Open Nos. 2006-156508 and 2018-22114.

Japanese Patent Laid-Open No. 2006-156508 discloses a technique in which, in an exposure apparatus using a projection optical system, the thickness distribution of a substrate and the height distribution of the holding surface which holds the substrate are measured in advance, and the height distribution of the surface of the substrate held by the holding surface is obtained from the measurement results. Japanese Patent Laid-Open No. 2018-22114 discloses a technique in which, in an exposure apparatus using a projection optical system, the surface of a substrate is measured for two different directions, thereby shortening the time required to measure the height distribution of the surface of the substrate.

However, according to the related arts, if the driving method of a drive unit that drives a substrate holding unit including the holding surface which holds a substrate is an air-floating method, the floating amount (height) of the substrate holding unit changes due to pressure fluctuation, and this may influence height measurement of the surface of the substrate. Note that an example of the factor of pressure fluctuation is, for example, pressure fluctuation on the side of a factory facility that supplies air to the exposure apparatus (drive unit).

SUMMARY OF THE INVENTION

The present invention provides a technique advantageous in measuring the height distribution of the surface of a substrate.

According to one aspect of the present invention, there is provided a measurement method including while driving a measurement target region of a surface of a substrate in a first direction with respect to a measurement unit by a drive unit configured to drive, in a floating state, a holding unit including a holding surface configured to hold the substrate, obtaining first measurement information indicating a height of the measurement target region in each of a plurality of first measurement lines parallel to the first direction and different from each other by measuring each measurement line by the measurement unit, while driving the measurement target region with respect to the measurement unit in a second direction crossing all of the plurality of first measurement lines by the drive unit, obtaining second measurement information indicating a height of the measurement target region in one second measurement line parallel to the second direction by measuring the second measurement line by the measurement unit, and generating first distribution information indicating a height distribution of the measurement target region based on the first measurement information and the second measurement information.

Further aspects of the present invention will become apparent from the following description of exemplary embodiments with reference to the attached drawings.

DESCRIPTION OF THE EMBODIMENTS

Figure 1:
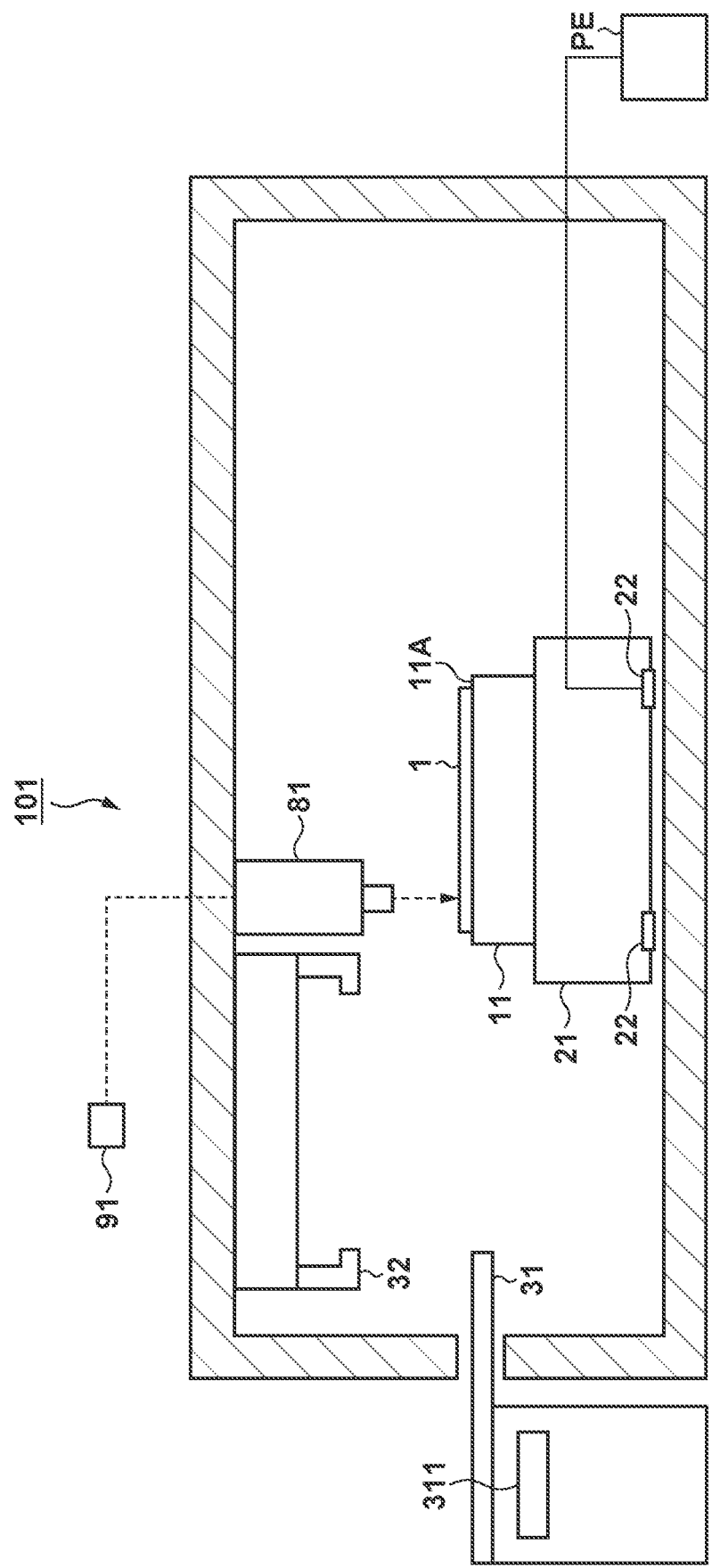
FIG. 1 is a schematic view illustrating configurations of an imprint apparatus according to the first embodiment of the present invention.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

First Embodiment

FIG. 1 is a schematic view illustrating configurations of an imprint apparatus 101 according to the first embodiment of the present invention. The imprint apparatus 101 is a lithography apparatus that is employed in a lithography step, which is a manufacturing step of a device such as a semiconductor device, a liquid crystal display device, a magnetic storage medium, or the like serving as an article, and forms a pattern on a substrate. The imprint apparatus 101 brings an uncured imprint material supplied onto a substrate into contact with a mold and applies curing energy to the imprint material, thereby forming a pattern of a cured product to which a pattern of the mold has been transferred.

As the imprint material, a material (curable composition) to be cured by receiving curing energy is used. An example of the curing energy that is used is electromagnetic waves, heat, or the like. As the electromagnetic waves, for example, infrared light, visible light, ultraviolet light, and the like selected from the wavelength range of 10 nm (inclusive) to 1 mm (inclusive) is used.

The curable composition is a composition cured by light irradiation or heating. The photo-curable composition cured by light irradiation contains at least a polymerizable compound and a photopolymerization initiator, and may contain a nonpolymerizable compound or a solvent, as needed. The nonpolymerizable compound is at least one type of material selected from a group comprising of a sensitizer, a hydrogen donor, an internal mold release agent, a surfactant, an antioxidant, a polymer component, and the like.

The imprint material may be applied in a film shape onto the substrate by a spin coater or a slit coater. The imprint material may be applied, onto the substrate, in a droplet shape or in an island or film shape formed by connecting a plurality of droplets using a liquid injection head. The viscosity (the viscosity at 25° C.) of the imprint material is, for example, 1 mPa·s (inclusive) to 100 mPa·s (inclusive).

As the substrate, glass, ceramic, a metal, a semiconductor, a resin, or the like is used, and a member made of a material different from that of the substrate may be formed on the surface of the substrate, as needed. More specifically, examples of the substrate include a silicon wafer, a semiconductor compound wafer, silica glass, and the like.

The imprint apparatus 101 performs an imprint process of forming a pattern of an imprint material on a substrate using a mold. The imprint process includes a supply step, a contact step which is performed after the supply step, a curing step which is performed after the contact step, and a releasing step which is performed after the curing step. In the supply step, the imprint material in a droplet state is supplied (arranged) onto a shot region of the substrate. In the contact step, the imprint material on a part of the shot region of the substrate is brought into contact with the pattern surface of the mold, and then the contact region between the imprint material and the pattern surface is extended over the entire area of the shot region. In the curing step, the imprint material is cured in a state in which the imprint material on the shot region of the substrate is in contact with the pattern surface of the mold. In the releasing step, a cured product of the imprint material on the shot region of the substrate is released from the pattern surface of the mold.

As shown in FIG. 1, the imprint apparatus 101 includes a substrate holding unit 11 including a holding surface 11A which holds a substrate 1, and a drive unit 21 that drives the substrate holding unit 11 to position the substrate 1. The imprint apparatus 101 also includes a substrate conveyance unit 31 that conveys (places) the substrate 1 to the substrate holding unit 11, and a holding unit conveyance unit 32 that conveys (places) the substrate holding unit 11 to the drive unit 21. The imprint apparatus 101 further includes a first measurement unit 81 and a first control unit 91.

In this embodiment, the substrate holding unit 11 is formed by a pin chuck, and holds the substrate 1 by vacuum-chucking the substrate 1. The substrate 1 can maintain the placed position by being vacuum-chucked by the substrate holding unit 11. Note that the substrate holding unit 11 is not limited to the pin chuck, and may be formed by an electrostatic chuck.

The drive unit 21 holds the substrate holding unit 11 by, for example, vacuum-chucking the substrate holding unit 11. The drive unit 21 employs an air-floating method as the drive method, and injects a gas from an injection unit 22, thereby driving in the horizontal direction while maintaining a state of floating up about several μm from the floor on which the imprint apparatus 101 is installed. The gas injected from the injection unit 22 is, for example, clean dry air, and supplied, from a factory facility PE where the imprint apparatus 101 is installed, to the injection unit 22 via a gas supply pipe or the like.

The substrate conveyance unit 31 includes a rotation mechanism 311 that rotates the substrate 1 around a vertical axis (that is, rotates the substrate 1 to a predetermined angle) upon conveying the substrate 1 to the substrate holding unit 11. For example, the rotation mechanism 311 may be implemented by rotating a link mechanism for a plurality of robot hands, or may be implemented by rotating the robot hand itself. The rotation mechanism 311 includes a measuring device, an encoder, or the like that measures the rotation angle of the substrate 1 using a notch or a cutout provided in the outer peripheral portion of the substrate 1.

In addition to a function of conveying the substrate holding unit 11, the holding unit conveyance unit 32 may have a function of cleaning the substrate holding unit 11, more specifically, the holding surface 11A of the substrate holding unit 11.

The first measurement unit 81 has a function of measuring the distance to the substrate 1 held by the substrate holding unit 11 (the distance between the first measurement unit 81 and the surface of the substrate 1). By measuring the distance to the substrate 1 by the first measurement unit 81 while moving (scanning) the substrate holding unit 11 holding the substrate 1 in the horizontal direction, it is possible to obtain the height distribution of the entire substrate 1, more specifically, the surface of the substrate 1. As the first measurement unit 81, a laser displacement meter, a spectroscopic interferometer, or the like is used, but the first measurement unit 81 is not limited to this, and any measuring device capable of measuring the distance to the substrate 1 with high precision (accurately) without contact may be used.

The first control unit 91 is formed by an information processing apparatus (computer) including a CPU, a memory, and the like, and controls respective units of the imprint apparatus 101 in accordance with programs stored in a storage unit. For example, the first control unit 91 controls an imprint process of forming a pattern of an imprint material on a substrate using a mold. In this embodiment, the first control unit 91 also has a function of processing measurement results measured by the first measurement unit 81.

Figure 2:
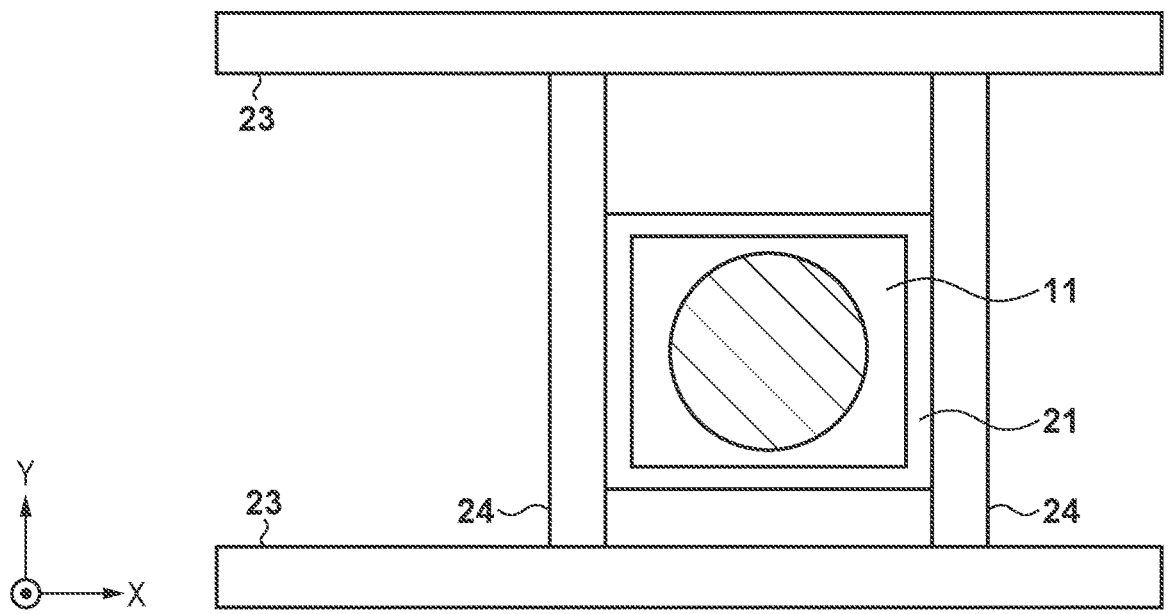
FIG. 2 is a schematic view showing an example of the arrangement of a drive unit of the imprint apparatus shown in FIG. 1.

FIG. 2 is a schematic view showing an example of the arrangement of the drive unit 21 in this embodiment. The drive unit 21 includes two guides parallel to directions orthogonal to each other, more specifically, an X-direction guide 23 and a Y-direction guide 24, and can drive to arbitrary X-direction and Y-direction positions. Each of the guides 23 and 24 is formed by, for example, a linear motor. The position of the drive unit 21 is measured using, for example, an encoder or a scale provided in each of the guides 23 and 24, and the drive unit 21 is positioned based on the measurement results under the control of the first control unit 91.

Figure 3:
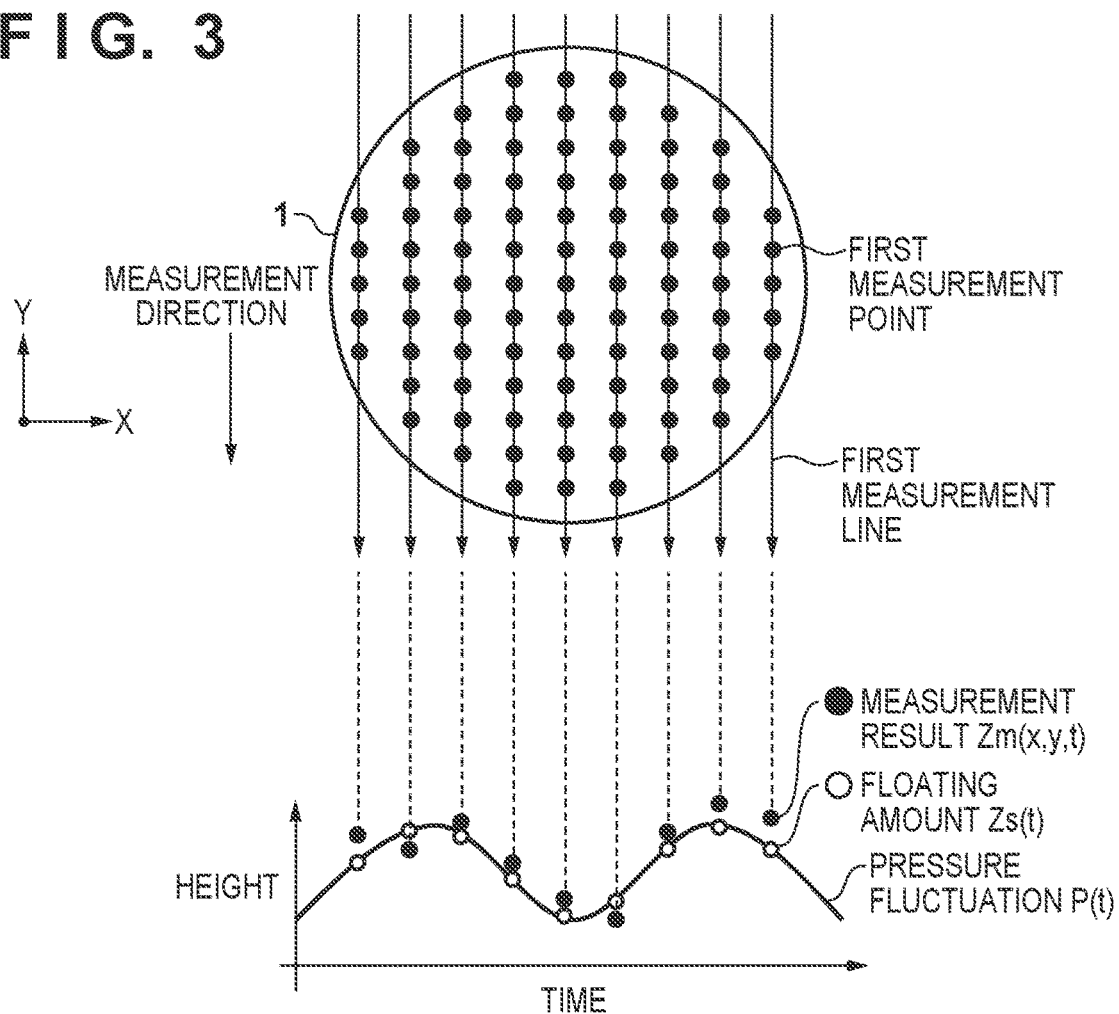
FIG. 3 is a view showing the relationship between a measurement result of a first measurement unit and a floating amount of the drive unit.

FIG. 3 is a view showing the relationship between a measurement result Zm obtained by measuring the distance to the surface of the substrate 1 by the first measurement unit 81 and a floating amount Zs of the drive unit 21 at the time of measuring the distance to the surface of the substrate 1 by the first measurement unit 81. Here, while the drive unit 21 drives a measurement target region of the surface of the substrate 1 in the Y direction (first direction) with respect to the first measurement unit 81 (measurement field of view), a plurality of first measurement points set in each of a plurality of first measurement lines parallel to the Y direction and different from each other are measured. Note that in this embodiment, the direction of driving (scanning) the substrate 1 with respect to the first measurement unit 81 is the Y direction, but the present invention is not limited to this, and the direction may be the X direction or a diagonal direction.

Let P be the pressure fluctuation of the gas supplied, from the factory facility PE where the imprint apparatus 101 is installed, to the injection unit 22 via a gas supply pipe or the like to cause the drive unit 21 to float up. The pressure fluctuation P of the gas supplied from the factory facility PE depends on the performance of a pump for generating a force, and shows long-period behavior. Although the width of the pressure fluctuation P (pressure fluctuation width) differs for each factory facility where a semiconductor manufacturing apparatus such as the imprint apparatus 101 is installed, it is generally about several tens of kPa. In the semiconductor manufacturing apparatus, the pressure of the gas supplied from the factory facility is regulated to have a predetermined pressure value and a predetermined pressure fluctuation width via a pressure regulating valve or the like. For example, if highly precise pressure regulation is required, the pressure fluctuation width can be suppressed to about several kPa by using a precise pressure regulating valve or the like.

In the imprint apparatus 101, for each shot region of the substrate 1, a process of controlling the attitude of at least one of the mold and the substrate 1 is performed to set the surface of the substrate 1 parallel to the pattern surface of the mold. Therefore, it is necessary to obtain the height distribution of the surface of the substrate 1 on the nm order.

However, if the drive unit 21 has a structure coping with the pressure fluctuation P, even if the pressure fluctuation width is suppressed to about several kPa by a precise pressure regulating valve, the floating amount of the drive unit 21 may fluctuate by several tens of nm in synchronization with the pressure fluctuation P. In addition, the structure supporting the drive unit 21 and the first measurement unit 81 may be floated up by an air-mounting method to mitigate the influence of vibration components from the floor, and the structure may be influenced by the force fluctuation (pressure fluctuation P) of the factory facility PE. Even in a case in which the drive unit 21 and the first measurement unit 81 are supported by different structures in consideration of the influence of vibration caused by driving of the drive unit 21, either one of the drive unit 21 and the first measurement unit 81 may be influenced by the force fluctuation of the factory facility PE.

Referring to FIG. 3, the relationship between the floating amount Zs of the drive unit 21 and the pressure fluctuation P is expressed by following expression (1) where t is a time term. Referring to expression (1), it can be seen that the floating amount Zs of the drive unit 21 fluctuates in synchronization with the pressure fluctuation P that fluctuates with time.

$$Zs(t) \propto P(t) \qquad (1)$$

Let Zt be the height distribution of the surface of the substrate 1 in a state in which it is held by the substrate holding unit 11 (holding surface 11A thereof), Zw be the height distribution of the surface of the substrate 1 (substrate itself), and Zc be the height distribution of the holding surface 11A of the substrate holding unit 11. In this case, the height distribution Zt of the surface of the substrate 1 in the state in which it is held by the substrate holding unit 11 is expressed by following equation (2). Note that in equation (2), x and y represent the x- and y-coordinates of the measurement point, respectively, and Zsi represents an ideal value (constant value) of the floating amount of the drive unit 21.

$$Zt(x, y) = Zw(x, y) + Zc(x, y) + Zsi \qquad (2)$$

As has been described above, Zm represents the measurement result obtained by measuring the distance to the surface of the substrate 1 by the first measurement unit 81 while driving the substrate 1 (the substrate holding unit 11 holding the substrate 1) with respect to the first measurement unit 81 by the drive unit 21. In this case, the height distribution Zt of the surface of the substrate 1 in the state in which it is held by the substrate holding unit 11 is expressed by following equation (3):

$$Zm(x, y, t) = Zt(x, y) + Zs(t) \qquad (3)$$
$$Zt(x, y) = Zm(x, y, t) - Zs(t)$$

Since the floating amount Zs of the drive unit 21 is in synchronization with the pressure fluctuation P, for the measurement results (the results obtained by measuring the plurality of first measurement points set in one first measurement line) in a line with a short measurement time, there is a general correlation as shown in FIG. 3, and the influence of the pressure fluctuation P is small. On the other hand, if the number of the first measurement lines (the number of measurement lines) parallel to the Y direction is increased to obtain the height distribution Zt of the surface of the substrate 1 with high precision (accurately), the measurement time becomes long, and the influence of the pressure fluctuation P increases. Each of the surface of the substrate 1 and the holding surface 11A of the substrate holding unit 11 generally has a height distribution on the order of several tens of nm. Therefore, if the floating amount Zs of the drive unit 21 fluctuates at the same level as this, the floating amount Zs of the drive unit 21 needs to be measured by another measuring device to obtain the height distribution Zt of the surface of the substrate 1.

Figure 4A:
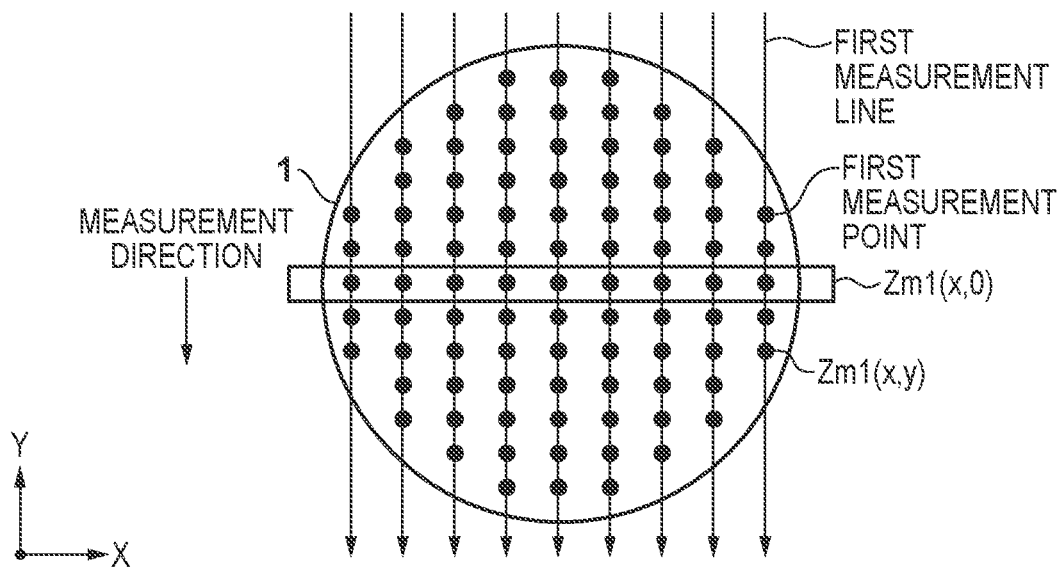
FIGS. 4A and 4B are views for describing a measurement method according to the first embodiment.
Figure 4B:
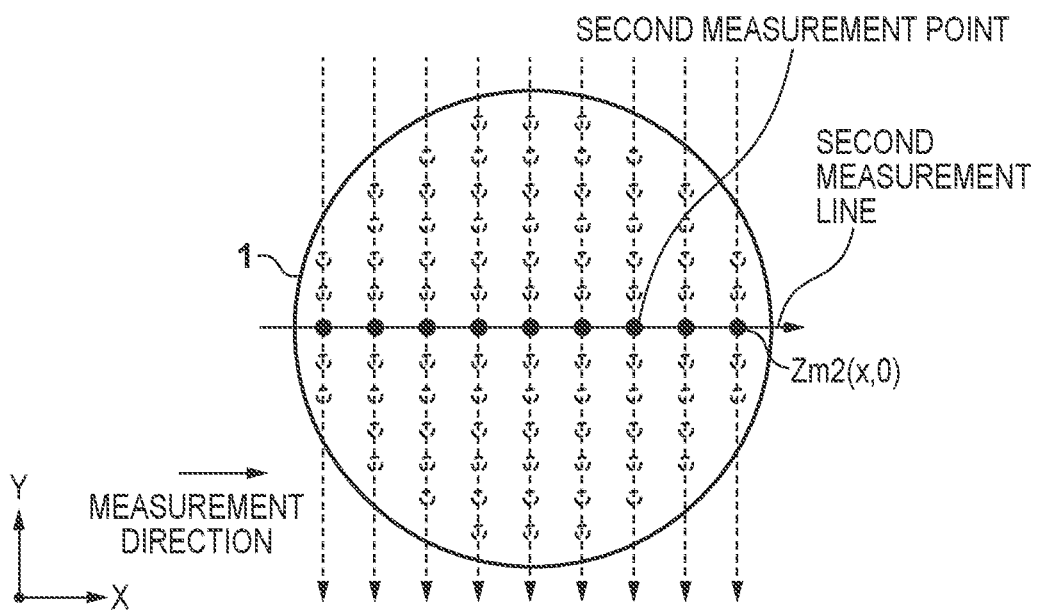

FIGS. 4A and 4B are views for describing a measurement method of measuring the height distribution of the surface of the substrate 1 in this embodiment. In FIGS. 4A and 4B, the entire region of the surface of the substrate 1 is a measurement target region. FIG. 4A shows the plurality of first measurement points set in each of the plurality of first measurement lines parallel to the Y direction (first direction) and different from each other. FIG. 4B shows a plurality of second measurement points set in one second measurement line parallel to the X direction (second direction) orthogonal to the Y direction. In this embodiment, the plurality of first measurement points and the plurality of second measurement points are set such that, for each of the plurality of first measurement lines, one measurement point of the plurality of first measurement points overlaps one measurement point of the plurality of second measurement points.

Referring to FIG. 4A, in this embodiment, for each of the plurality of first measurement lines, the first measurement unit 81 measures the distance to each measurement point (each of the first measurement points) while the drive unit 21 drives the substrate 1 in the Y direction with respect to the first measurement unit 81. Similarly, referring to FIG. 4B, in this embodiment, for one second measurement line, the first measurement unit 81 measures the distance to each measurement point (each of the second measurement points) while the drive unit 21 drives the substrate 1 in the X direction with respect to the first measurement unit 81. In this embodiment, it is assumed that measurement is performed on the plurality of first measurement points set in each of the plurality of first measurement lines (FIG. 4A), and then performed on the plurality of second measurement points set in the second measurement line (FIG. 4B). However, measurement may be performed on the plurality of second measurement points set in the second measurement line and then performed on the plurality of first measurement points set in each of the plurality of first measurement lines.

Note that in FIGS. 4A and 4B, it is set that the first direction is the Y direction and the second direction is the X direction, but the present invention is not limited to this. For example, the first direction may be the X direction and the second direction may be the Y direction, or the first direction may be a diagonal direction and the second direction may be a direction orthogonal to the diagonal direction. Further, it is set that the second direction is a direction orthogonal to the first direction, but the present invention is not limited to this, and the second direction may be any direction that crosses all of the plurality of first measurement lines. Note that if the first direction and the second direction are parallel to the X-direction guide 23 and the Y-direction guide 24 of the drive unit 21, respectively, this is advantageous in the term of heat generation of the drive unit 21 and in the term of position reproducibility. In other words, the first direction is preferably a direction parallel to one guide (for example, the X-direction guide 23) of the two guides 23 and 24, and the second direction is preferably a direction parallel to the other guide (for example, the Y-direction guide 24) of the two guides 23 and 24.

As shown in FIG. 4A, let Zm1 be the measurement result (the distance to the surface (first measurement point) of the substrate 1) in the first measurement line obtained by measuring each first measurement point by the first measurement unit 81 while the drive unit 21 drives the substrate 1 in the Y direction. Further, as shown in FIG. 4B, let Zm2 be the measurement result (the distance to the surface (second measurement point) of the substrate 1) in the second measurement line obtained by measuring each second measurement point by the first measurement unit 81 while the drive unit 21 drives the substrate 1 in the X direction.

Here, for the measurement results Zm1 in one first measurement line, since the measurement time is short and the fluctuation in floating mount Zs of the drive unit 21 is sufficiently small, the fluctuation in floating amount Zs of the drive unit 21 can be ignored. Similarly, for the measurement results Zm2 in the second measurement line, since there is only one second measurement line, the fluctuation in floating amount Zs of the drive unit 21 can be ignored.

Accordingly, for example, in Y=0, the measurement result Zm1(x, 0) in the first measurement line and the measurement result Zm2(x, 0) in the second measurement line should match since the same measurement point (portion) on the substrate is measured as shown in FIGS. 4A and 4B.

Therefore, in this embodiment, in Y=0, the measurement result Zm1(x, 0) in the first measurement line is corrected such that the measurement result Zm1(x, 0) in the first measurement line becomes equal to (matches) the measurement result Zm2(x, 0) in the second measurement line. In other words, the measurement result Zm1(x, 0) in the first measurement line is corrected using the measurement result Zm2(x, 0) in the second measurement line as a reference. In this case, the height distribution Zt of the surface of the substrate 1 in the state in which it is held by the substrate holding unit 11 is expressed by following expression (4):

$$Zt(x, y) \fallingdotseq Zm1(x, y) - Zm1(x, 0) + Zm2(x, 0) \qquad (4)$$

In this embodiment, the measurement results in Y=0, more specifically, the measurement result Zm1(x, 0) in the first measurement line and the measurement result Zm2(x, 0) in the second measurement line are used, but the present invention is not limited to this. For example, as long as one measurement point of the plurality of first measurement points set in each first measurement line overlaps one measurement point of the plurality of second measurement points set in the second measurement line, the measurement points to be used are not limited to those in Y=0.

Figure 5A:
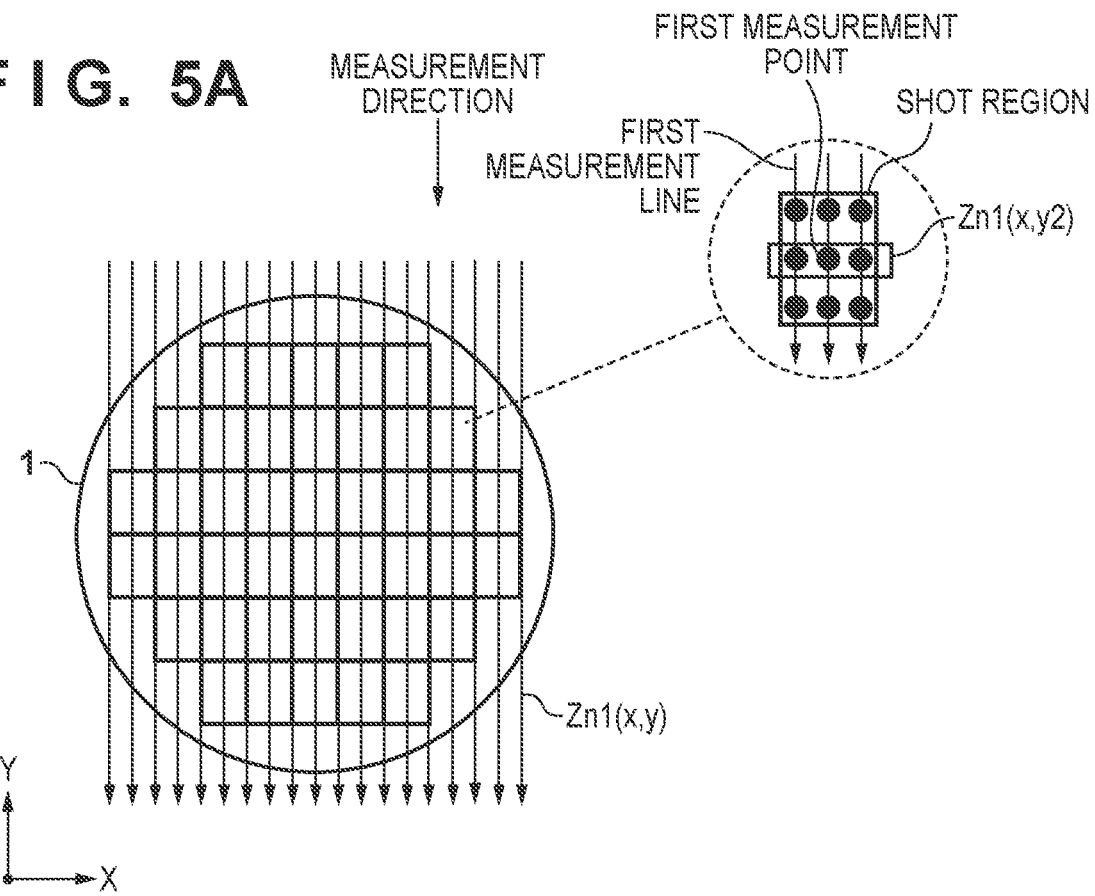
FIGS. 5A and 5B are views for describing a measurement method according to the first embodiment.
Figure 5B:
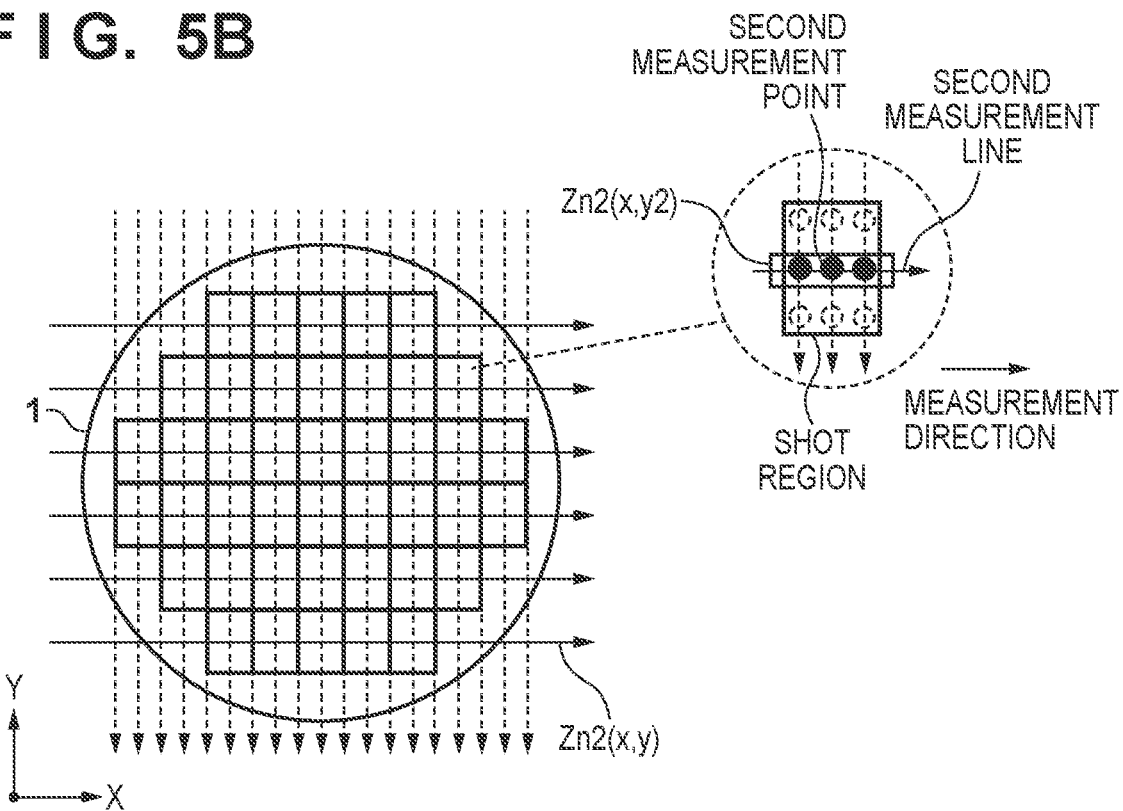

FIGS. 5A and 5B are views for describing a measurement method of measuring the height distribution for each local region of the surface of the substrate 1 in this embodiment. In FIGS. 5A and 5B, a partial region of the surface of the substrate 1, more specifically, a shot region is a measurement target region. FIG. 5A shows a plurality of first measurement points set in each of a plurality of first measurement lines parallel to the Y direction (first direction) and different from each other in a shot region which is a local region of the surface of the substrate 1. FIG. 5B shows a plurality of second measurement points set in one second measurement line parallel to the X direction (second direction) orthogonal to the Y direction in the shot region which is the local region of the surface of the substrate 1. Note that the second measurement line is preferably set so as to pass through the center of each shot region of the substrate 1.

As shown in FIG. 5A, let Zn1 be the measurement result (the distance to the surface (first measurement point) of the substrate 1) in the first measurement line obtained by measuring each first measurement point by the first measurement unit 81 while the drive unit 21 drives the substrate 1 in the Y direction. Further, let Zn1(x, y2) be the measurement result in the first measurement line in Y=y2 in the shot region of the substrate 1. Similarly, as shown in FIG. 5B, let Zn2 be the measurement result (the distance to the surface (second measurement point) of the substrate 1) in the second measurement line obtained by measuring each second measurement point by the first measurement unit 81 while the drive unit 21 drives the substrate 1 in the X direction. Further, let Zn2(x, y2) be the measurement result in the second measurement line in Y=y2 in the shot region of the substrate 1.

As in the description of FIGS. 4A and 4B, a height distribution Zt1 of the shot region of the substrate 1 in the state in which it is held by the substrate holding unit 11 is expressed by following expression (5):

$$Zt1(x, y) \fallingdotseq Zn1(x, y) - Zn1(x, y2) + Zn2(x, y2) \quad (5)$$

When the height distribution of a local region (for example, shot region) of the surface of the substrate 1 is obtained, the measurement method shown in FIGS. 5A and 5B can obtain the height distribution of the local region with higher precision (accurately) than the measurement method shown in FIGS. 4A and 4B.

Figure 6:
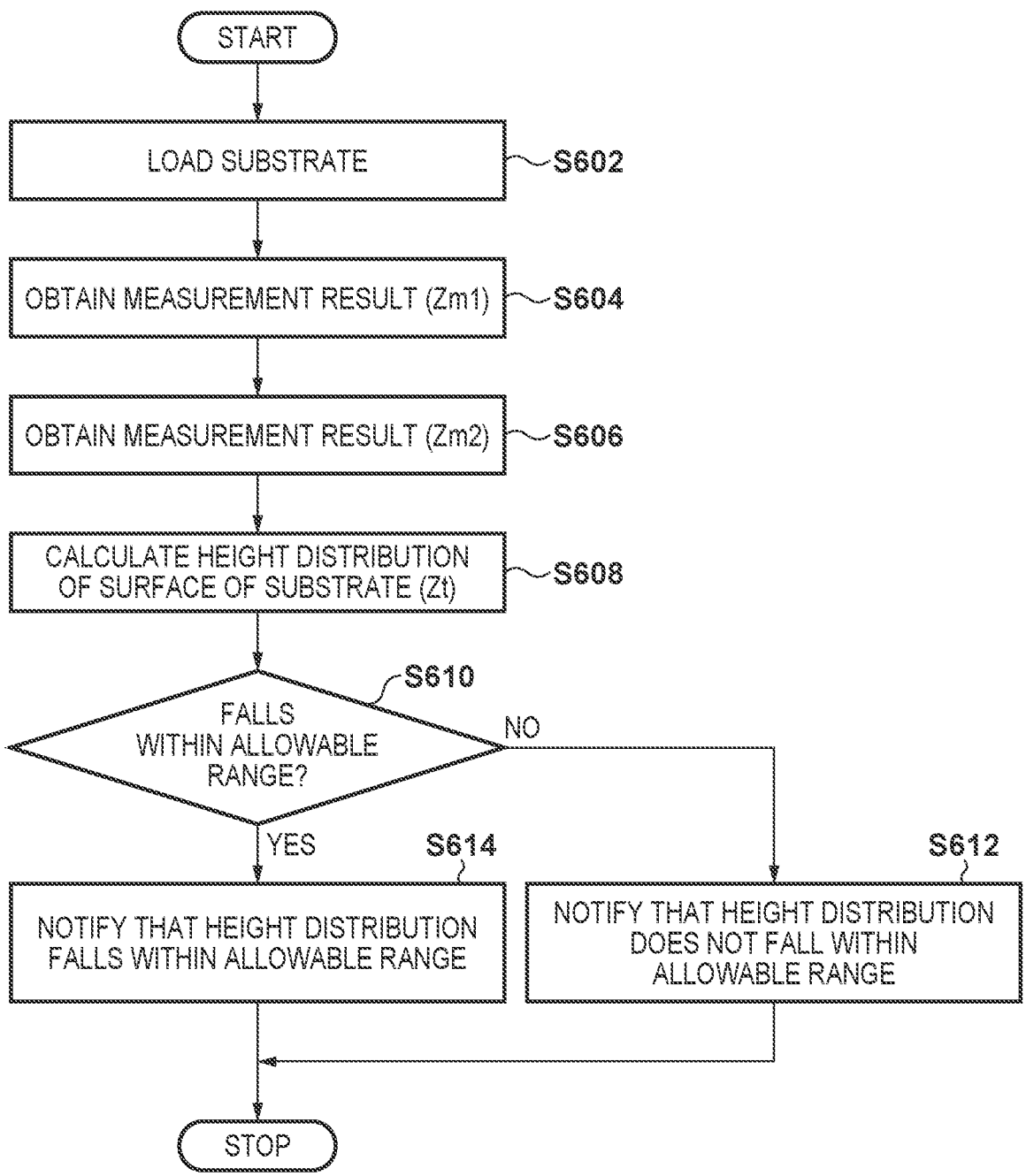
FIG. 6 is a flowchart for describing a measurement method according to the first embodiment.

With reference to FIG. 6, a method of checking the height distribution of the surface of the substrate 1 including the measurement method of measuring the height distribution of the surface of the substrate 1 in this embodiment will be described. This method is performed by the first control unit 91 comprehensively controlling the respective units of the imprint apparatus 101.

In step S602, the substrate 1 is loaded to the imprint apparatus 101. More specifically, the substrate 1 is loaded to the imprint apparatus 101 via the substrate conveyance unit 31, and the substrate 1 is held by the holding surface 11A of the substrate holding unit 11. The kind of the substrate 1 includes, for example, a bare silicon wafer, a super flatness wafer, a substrate with base coating, a substrate coated with a photosensitive material such as a resin material, or the like.

In step S604, while the drive unit 21 drives the substrate 1 in the Y direction with respect to the first measurement unit 81, the first measurement unit 81 measures the distance to each measurement point for each of the plurality of first measurement lines, thereby obtaining the measurement result Zm1 in the first measurement line. Thus, while the measurement target region of the surface of the substrate 1 is driven in the first direction (Y direction) with respect to the first measurement unit 81, the first measurement unit 81 measures each of the plurality of first measurement lines parallel to the first direction and different from each other. With this operation, the first measurement information (measurement result Zm1) indicating the height of the measurement target region of the surface of the substrate 1 in each measurement line of the plurality of first measurement lines is obtained.

In step S606, while the drive unit 21 drives the substrate 1 in the X direction with respect to the first measurement unit 81, the first measurement unit 81 measures the distance to each measurement point for one second measurement line, thereby obtaining the measurement result Zm2 in the second measurement line. Thus, while the measurement target region of the surface of the substrate 1 is driven in the second direction (X direction) with respect to the first measurement unit 81, the first measurement unit 81 measures one second measurement line parallel to the second direction. With this operation, the second measurement information (measurement result Zm2) indicating the height of the measurement target region of the surface of the substrate 1 in the second measurement line is obtained.

In step S608, based on the measurement result Zm1 in the first measurement line obtained in step S604 and the measurement result Zm2 in the second measurement line obtained in step S606, the height distribution Zt of the surface of the substrate 1 in the state in which it is held by the substrate holding unit 11 is calculated. More specifically, as has been described above, the height distribution Zt of the surface of the substrate 1 is calculated by correcting the measurement result Zm1 in the first measurement line such that the measurement result Zm1 in the first measurement line matches the measurement result Zm2 in the second measurement line. Thus, in step S608, first distribution information (the height distribution Zt of the surface of the substrate 1) indicating the height distribution of the measurement target region of the surface of the substrate 1 is generated based on the first measurement information (measurement result Zm1) and the second measurement information (measurement result Zm2).

In step S610, it is determined whether the height distribution Zt of the surface of the substrate 1 calculated in step S608 falls within an allowable range. If the height distribution Zt of the surface of the substrate 1 does not fall within the allowable range, the process transitions to step S612, and a notification is given. For example, by issuing an alert from the imprint apparatus 101, the user is notified that the height distribution Zt of the surface of the substrate 1 does not fall within the allowable range. On the other hand, if the height distribution Zt of the surface of the substrate 1 falls within the allowable range, the process transitions to step S614, and a notification is given. For example, the user is notified, via a display of the imprint apparatus 101, that the height distribution Zt of the surface of the substrate 1 falls within the allowable range.

Thus, according to this embodiment, even if the floating amount of the drive unit 21 fluctuates, it is possible to reduce the influence thereof and measure the height distribution of the surface of the substrate 1 with high precision.

Figure 7:
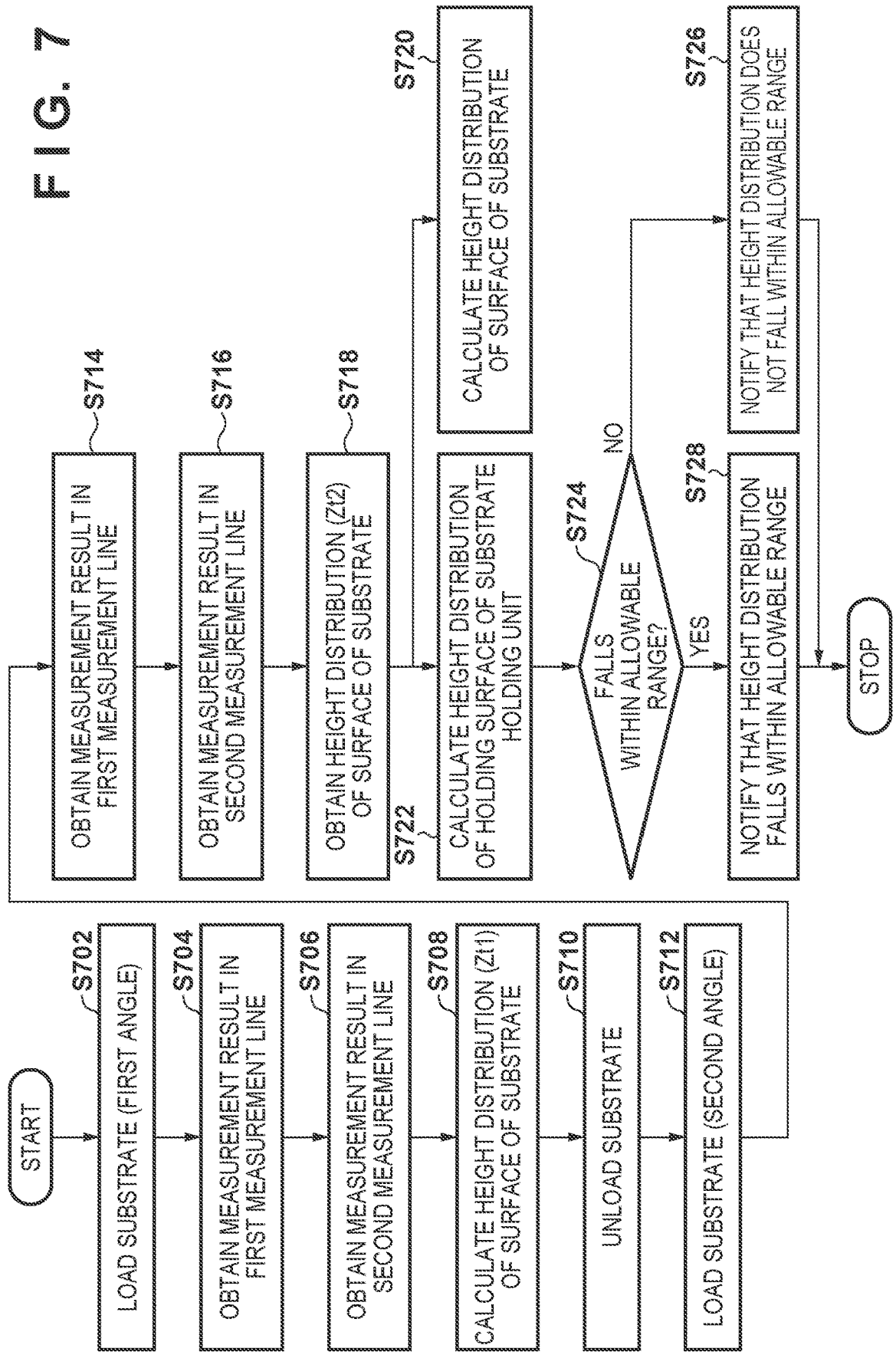
FIG. 7 is a flowchart for describing a measurement method according to the first embodiment.

With reference to FIG. 7, a method of checking the height distribution of the holding surface 11A of the substrate holding unit 11 including a measurement method of measuring the height distribution of the holding surface 11A of the substrate holding unit 11 in this embodiment will be described. This method is performed by the first control unit 91 comprehensively controlling the respective units of the imprint apparatus 101.

In step S702, the substrate 1 is loaded to the imprint apparatus 101. More specifically, the substrate 1 is rotated to a first angle by the rotation mechanism 311 of the substrate conveyance unit 31 and, in this state, held by the holding surface 11A of the substrate holding unit 11. In other words, the angle of the substrate 1 on the holding surface 11A of the substrate holding unit 11 is set to the first angle. The value of the first angle is an arbitrary value. In this embodiment, the first angle is 0° as an example.

Since steps S704, S706, and S708 are similar to steps S604, S606, and S608 shown in FIG. 6, respectively, a detailed description thereof will be omitted here. By undergoing steps S704, S706, and S708, the height distribution Zt1 of the surface of the substrate 1 in a state in which the angle of the substrate 1 on the holding surface 11A of the substrate holding unit 11 is set to the first angle is calculated.

In step S710, the substrate 1 is unloaded from the imprint apparatus 101. More specifically, the substrate 1 is unloaded from the substrate holding unit 11 (holding surface 11A) to the outside of the imprint apparatus 101 via the substrate conveyance unit 31.

In step S712, the substrate 1 is loaded to the imprint apparatus 101. More specifically, the substrate 1 is rotated to a second angle by the rotation mechanism 311 of the substrate conveyance unit 31 and, in this state, held by the holding surface 11A of the substrate holding unit 11. In other words, the angle of the substrate 1 on the holding surface 11A of the substrate holding unit 11 is set to the second angle. The second angle is only required to be different from the first angle and may be, for example, 90° or 180°. In this embodiment, the second angle is 90°. Accordingly, the angle difference between the first angle and the second angle is 90° in this embodiment.

Since steps S714, S716, and S718 are similar to steps S604, S606, and S608 shown in FIG. 6, respectively, a detailed description thereof will be omitted here. By undergoing steps S714, S716, and S718, a height distribution Zt2 of the surface of the substrate 1 in a state in which the angle of the substrate 1 on the holding surface 11A of the substrate holding unit 11 is set to the second angle is calculated.

In step S720, based on the height distribution Zt1 of the surface of the substrate 1 calculated in step S708 and the height distribution Zt2 of the surface of the substrate 1 calculated in S718, the height distribution Zt of the surface of the substrate 1 in the state in which it is held by the substrate holding unit 11 is calculated. For example, an average of the height distribution Zt1 of the surface of the substrate 1 and the height distribution Zt2 of the surface of the substrate 1 may be used as the height distribution Zt of the surface of the substrate 1. Alternatively, either one of the height distribution Zt1 of the surface of the substrate 1 and the height distribution Zt2 of the surface of the substrate 1 may be used as the height distribution Zt of the surface of the substrate 1.

In step S722, based on the height distribution Zt1 of the surface of the substrate 1 calculated in step S708 and the height distribution Zt2 of the surface of the substrate 1 calculated in step S718, the height distribution of the holding surface 11A of the substrate holding unit 11 is calculated. Thus, based on the first measurement information and the second measurement information obtained in steps S704 and S706, respectively, and the first measurement information and the second measurement information obtained in steps S714 and S716, respectively, second distribution information indicating the height distribution of the holding surface 11A is generated.

Here, let Zw_0 be the height distribution of the surface of the substrate 1 (substrate itself) at the first angle, Zw_90 be the height distribution of the surface of the substrate 1 (substrate itself) at the second angle, and Zc be the height distribution of the holding surface 11A of the substrate holding unit 11. In this case, letting R_90 be the rotation matrix at the time of rotation by 90° around the vertical axis passing through the center of the substrate 1, following equations (6), (7), and (8) hold:

$$Zt1 = Zw\_0 + Zc \quad (6)$$

$$Zt2 = Zw\_90 + Zc \quad (7)$$

$$Zw\_90 = R\_90 \times Zw\_0 \quad (8)$$

From equations (6), (7), and (8), the height distribution Zc of the holding surface 11A of the substrate holding unit 11 is expressed by following equation (9). Note that in equation (9), E represents a unit matrix, and R_90' represents an inverse matrix of R_90.

$$Zc = (E - R\_90) \times (Zt1 - R\_90' \times Zt2) \quad (9)$$

In step S722, by performing calculation processing using the above-described equation, the height distribution of the holding surface 11A of the substrate holding unit 11 is calculated.

In step S724, it is determined whether the height distribution of the holding surface 11A of the substrate holding unit 11 calculated in step S722 falls within an allowable range. If the height distribution of the holding surface 11A of the substrate holding unit 11 does not fall within the allowable range, the process transitions to step S726, and a notification is given. For example, by issuing an alert from the imprint apparatus 101, the user is notified that the height distribution of the holding surface 11A of the substrate holding unit 11 does not fall within the allowable range. In the imprint apparatus 101, in accordance with the contents of the alert, the substrate holding unit 11 may be conveyed to a cleaning apparatus or replaced via the holding unit conveyance unit 32. On the other hand, if the height distribution of the holding surface 11A of the substrate holding unit 11 falls within the allowable range, the process transitions to step S728, and a notification is given. For example, the user is notified, via a display of the imprint apparatus 101, that the height distribution of the holding surface 11A of the substrate holding unit 11 falls within the allowable range.

Thus, according to this embodiment, it is possible to measure the height distribution of the holding surface 11A of the substrate holding unit 11 with high precision. Particularly, if the substrate holding unit 11 is a pin chuck, since it is difficult to directly measure the height of the holding surface 11A, the measurement method according to this embodiment is useful. Note that in this embodiment, the height distribution Zw of the surface of the substrate 1 (substrate itself) can be also calculated from the above-described equations.

Second Embodiment

Figure 8:
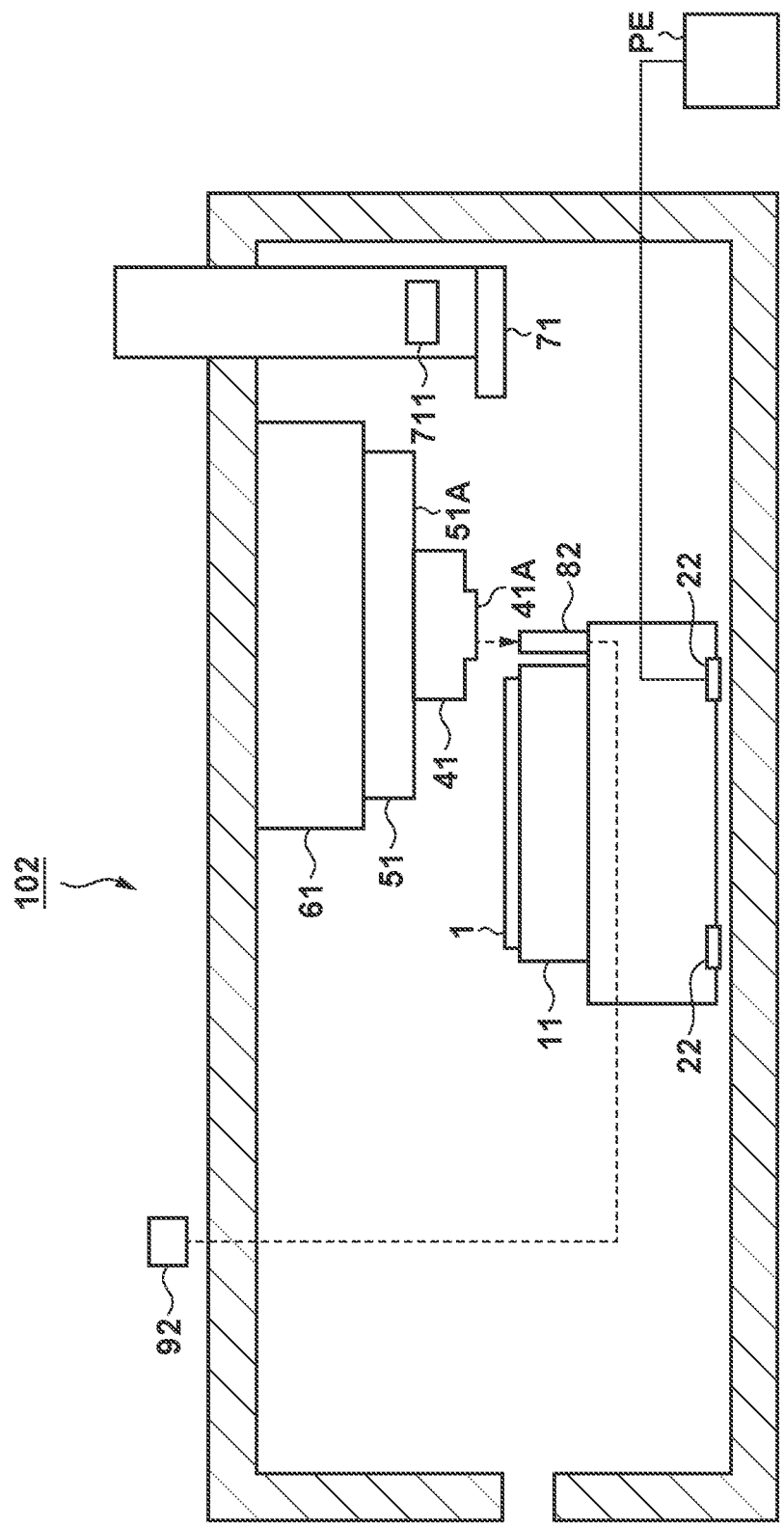
FIG. 8 is a schematic view illustrating configurations of an imprint apparatus according to the second embodiment of the present invention.

FIG. 8 is a schematic view illustrating configurations of an imprint apparatus 102 in the second embodiment of the present invention. The imprint apparatus 102 brings an uncured imprint material supplied onto a substrate into contact with a mold and applies curing energy to the imprint material, thereby forming a pattern of a cured product to which a pattern of the mold has been transferred.

As shown in FIG. 8, the imprint apparatus 102 includes a substrate holding unit 11 and a drive unit 21. The imprint apparatus 102 also includes a mold holding unit 51 including a holding surface 51A which holds a mold 41, a mold drive unit 61 that drives the mold holding unit 51 in the Z direction (height direction), and a mold conveyance unit 71 that conveys (places) the mold 41 to the mold holding unit 51. The imprint apparatus 102 further includes a second measurement unit 82 and a second control unit 92.

In this embodiment, the mold holding unit 51 holds the mold 41 by vacuum-chucking the mold 41. The mold 41 can maintain the placed position by being vacuum-chucked by the mold holding unit 51. Note that the mold holding unit 51 may hold the mold 41 by an electrostatic method, or may hold the mold 41 by physically restraining the end face of the mold 41.

The mold conveyance unit 71 includes a rotation mechanism 711 that rotates the mold 41 around a vertical axis (that is, rotates the mold 41 to a predetermined angle) upon conveying the mold 41 to the mold holding unit 51. For example, the rotation mechanism 711 may be implemented by rotating a link mechanism for a plurality of robot hands, or may be implemented by rotating the robot hand itself. In addition to a function of conveying the mold 41, the mold conveyance unit 71 may have a function of cleaning the mold holding unit 51, more specifically, the holding surface 51A of the mold holding unit 51.

The second measurement unit 82 is provided on the drive unit 21, and has a function of measuring the distance to the mold 41 held by the mold holding unit 51 (the distance between the second measurement unit 82 and a pattern surface 41A of the mold 41). By measuring the distance to the pattern surface 41A of the mold 41 by the second measurement unit 82 while driving (scanning) the drive unit 21 provided with the second measurement unit 82 in the horizontal direction, it is possible to obtain the height distribution of the pattern surface 41A of the mold 41. As the second measurement unit 82, a laser displacement meter, a spectroscopic interferometer, or the like is used, but the second measurement unit 82 is not limited to this, and any measuring device capable of measuring the distance to the pattern surface 41A of the mold 41 with high precision (accurately) without contact may be used.

The second control unit 92 is formed by an information processing apparatus (computer) including a CPU, a memory, and the like, and controls respective units of the imprint apparatus 102 in accordance with programs stored in a storage unit. For example, the second control unit 92 controls an imprint process of forming a pattern of an imprint material on a substrate using a mold. In this embodiment, the second control unit 92 also has a function of processing measurement results measured by the second measurement unit 82.

Figure 9A:
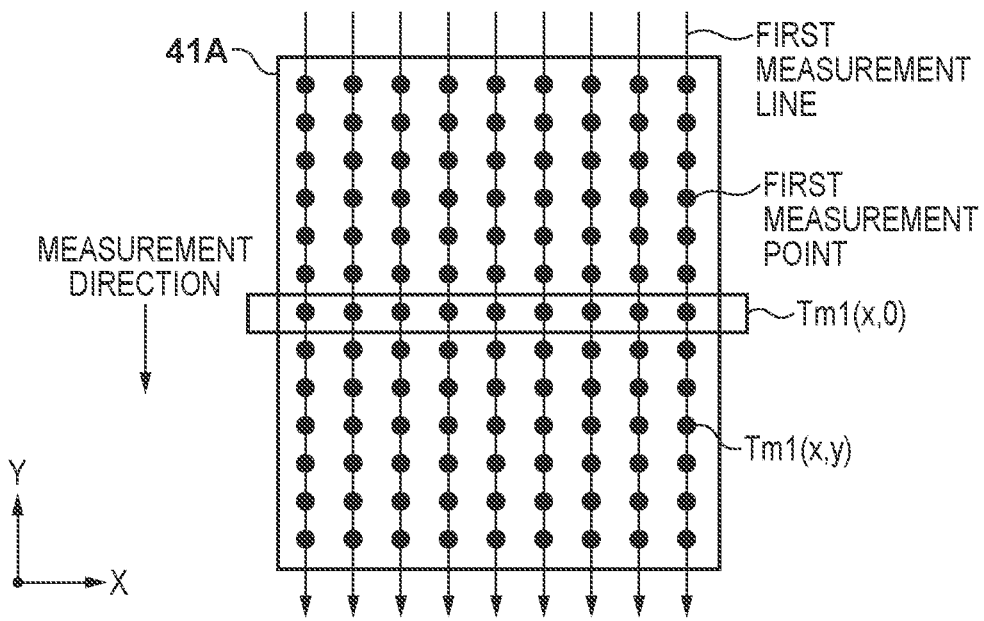
FIGS. 9A and 9B are views for describing a measurement method according to the second embodiment.
Figure 9B:
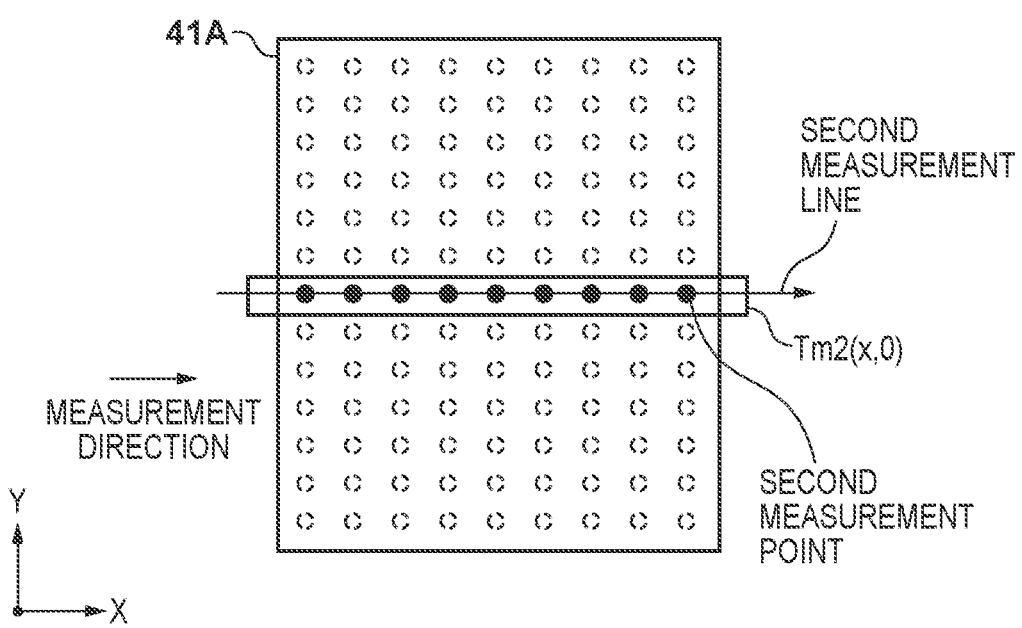

FIGS. 9A and 9B are views for describing a measurement method of measuring the height distribution of the pattern surface 41A of the mold 41 in this embodiment. In FIGS. 9A and 9B, the pattern surface 41A of the mold 41 is a measurement target region. FIG. 9A shows a plurality of first measurement points set in each of a plurality of first measurement lines parallel to the Y direction (first direction) and different from each other. FIG. 9B shows a plurality of second measurement points set in one second measurement line parallel to the X direction (second direction) orthogonal to the Y direction. In this embodiment, the plurality of first measurement points and the plurality of second measurement points are set such that, for each of the plurality of first measurement lines, one measurement point of the plurality of first measurement points overlaps one measurement point of the plurality of second measurement points.

Referring to FIG. 9A, in this embodiment, for each of the plurality of first measurement lines, the second measurement unit 82 measures the distance to each measurement point (each of the first measurement points) while the drive unit 21 drives the second measurement unit 82 in the Y direction with respect to the mold 41. Similarly, referring to FIG. 9B, in this embodiment, for one second measurement line, the second measurement unit 82 measures the distance to each measurement point (each of the second measurement points) while the drive unit 21 drives the second measurement unit 82 in the X direction with respect to the mold 41. In this embodiment, it is assumed that measurement is performed on the plurality of first measurement points set in each of the plurality of first measurement lines (FIG. 9A), and then performed on the plurality of second measurement points set in the second measurement line (FIG. 9B). However, measurement may be performed on the plurality of second measurement points set in the second measurement line and then performed on the plurality of first measurement points set in each of the plurality of first measurement lines.

Note that in FIGS. 9A and 9B, it is set that the first direction is the Y direction and the second direction is the X direction, but the present invention is not limited to this. For example, the first direction may be the X direction and the second direction may be the Y direction, or the first direction may be a diagonal direction and the second direction may be a direction orthogonal to the diagonal direction. Further, it is set that the second direction is a direction orthogonal to the first direction, but the present invention is not limited to this, and the second direction may be any direction that crosses all of the plurality of first measurement lines.

As shown in FIG. 9A, let Tm1 be the measurement result (the distance to the pattern surface 41A (first measurement point) of the mold 41) in the first measurement line obtained by measuring each first measurement point by the second measurement unit 82 while the drive unit 21 drives the second measurement unit 82 in the Y direction. Further, as shown in FIG. 9B, let Tm2 be the measurement result (the distance to the pattern surface 41A (second measurement point) of the mold 41) in the second measurement line obtained by measuring each second measurement point by the second measurement unit 82 while the drive unit 21 drives the second measurement unit 82 in the X direction.

As in the first embodiment, for the measurement results Tm1 in one first measurement line, since the measurement time is short and the fluctuation in floating mount Zs of the drive unit 21 is sufficiently small, the fluctuation in floating amount Zs of the drive unit 21 can be ignored. Similarly, for the measurement results Zm2 in the second measurement line, since there is only one second measurement line, the fluctuation in floating amount Zs of the drive unit 21 can be ignored. Accordingly, for example, in Y=0, the measurement result Tm1($x$, 0) in the first measurement line and the measurement result Tm2($x$, 0) in the second measurement line should match since the same measurement point (portion) on the pattern surface of the mold 41 is measured.

Therefore, in this embodiment, in Y=0, the measurement result Tm1($x$, 0) in the first measurement line is corrected such that the measurement result Tm1($x$, 0) in the first measurement line becomes equal to (matches) the measurement result Tm2($x$, 0) in the second measurement line. In other words, the measurement result Tm1($x$, 0) in the first measurement line is corrected using the measurement result Tm2($x$, 0) in the second measurement line as a reference. In this case, a height distribution Tt of the pattern surface 41A of the mold 41 in a state in which it is held by the mold holding unit 51 is expressed by following expression (10):

$$Tt(x, y) \fallingdotseq Tm1(x, y) - Tm1(x, 0) + Tm2(x, 0) \quad (10)$$

In this embodiment, the measurement results in Y=0, more specifically, the measurement result Tm1($x$, 0) in the first measurement line and the measurement result Tm2($x$, 0) in the second measurement line are used, but the present invention is not limited to this. For example, as long as one measurement point of the plurality of first measurement points set in each first measurement line overlaps one measurement point of the plurality of second measurement points set in the second measurement line, the measurement points to be used are not limited to those in Y=0.

Figure 10:
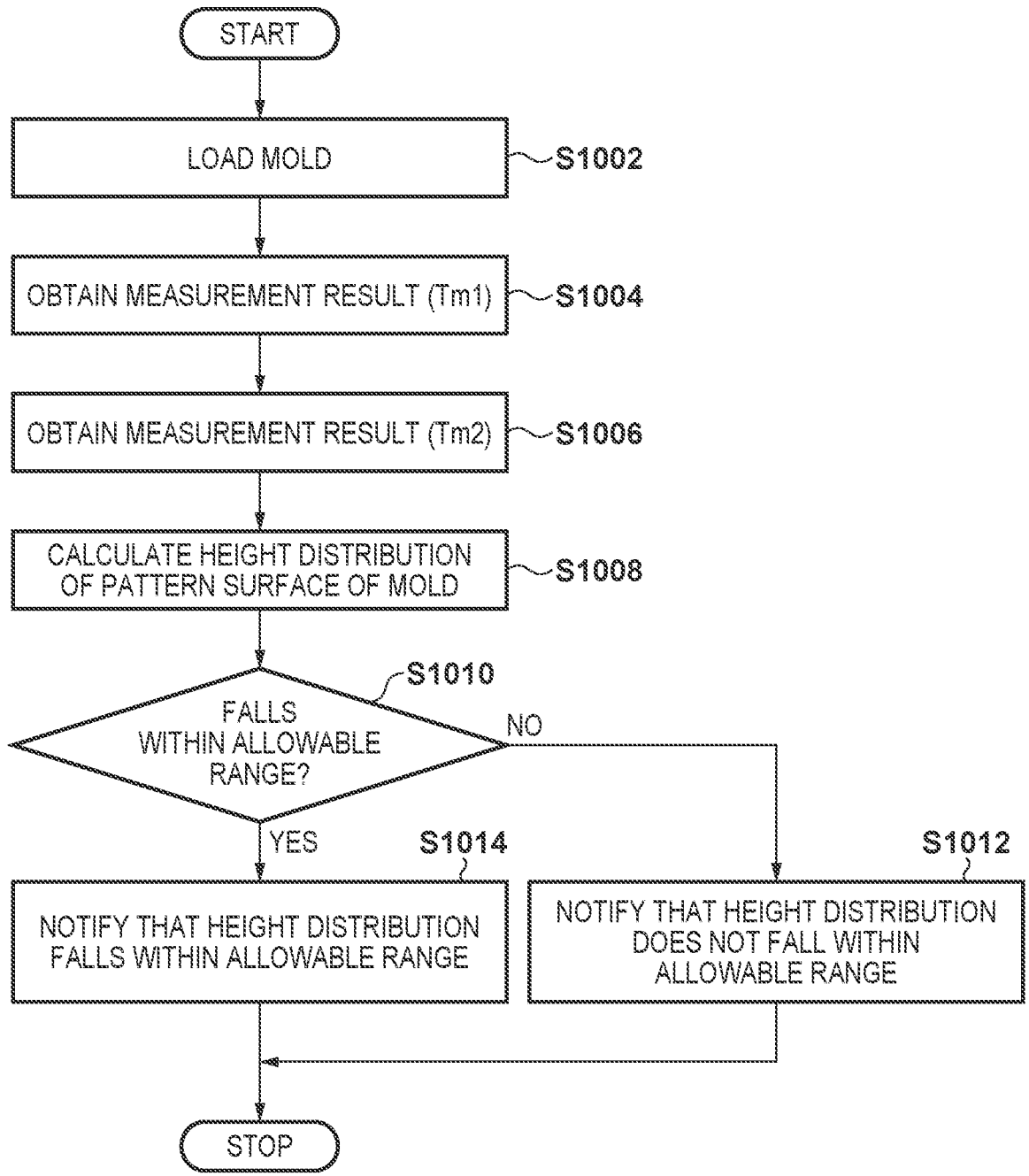
FIG. 10 is a flowchart for describing a measurement method according to the second embodiment.

With reference to FIG. 10, a method of checking the height distribution of the pattern surface 41A of the mold 41 including the measurement method of measuring the height distribution of the pattern surface 41A of the mold 41 in this embodiment will be described. This method is performed by the second control unit 92 comprehensively controlling the respective units of the imprint apparatus 102.

In step S1002, the mold 41 is loaded to the imprint apparatus 102. More specifically, the mold 41 is loaded to the imprint apparatus 102 via the mold conveyance unit 71, and the mold 41 is held by the holding surface 51A of the mold holding unit 51. In addition to the mold with a pattern surface formed therein, the kind of the mold 41 includes, for example, a mold with no pattern surface formed therein, a mold having a recessed structure on the side of a holding target surface of the mold, or the like.

In step S1004, while the drive unit 21 drives the second measurement unit 82 in the Y direction with respect to the mold 41, the second measurement unit 82 measures the distance to each measurement point for each of the plurality of first measurement lines, thereby obtaining the measurement result Tm1 in the first measurement line. Thus, while the second measurement unit 82 is driven in the first direction (Y direction) with respect to the mold 41, the second measurement unit 82 measures each of the plurality of first measurement lines parallel to the first direction and different from each other. With this operation, the first measurement information (measurement result Tm1) indicating the height of the pattern surface 41A of the mold 41 in each measurement line of the plurality of first measurement lines is obtained.

In step S1006, while the drive unit 21 drives the second measurement unit 82 in the X direction with respect to the mold 41, the second measurement unit 82 measures the distance to each measurement point for one second measurement line, thereby obtaining the measurement result Tm2 in the second measurement line. Thus, while the second measurement unit 82 is driven in the second direction (X direction) with respect to the mold 41, the second measurement unit 82 measures one second measurement line parallel to the second direction. With this operation, the second measurement information (measurement result Tm2) indicating the height of the pattern surface 41A of the mold 41 in the second measurement line is obtained.

In step S1008, based on the measurement result Tm1 in the first measurement line obtained in step S1004 and the measurement result Tm2 in the second measurement line obtained in step S1006, the height distribution Tt of the pattern surface 41A of the mold 41 in the state in which it is held by the mold holding unit 51 is calculated. More specifically, as has been described above, the height distribution Tt of the pattern surface 41A of the mold 41 is calculated by correcting the measurement result Tm1 in the first measurement line such that the measurement result Tm1 in the first measurement line matches the measurement result Tm2 in the second measurement line. Thus, in step S1008, distribution information (the height distribution Tt of the pattern surface 41A of the mold 41) indicating the height distribution of the pattern surface 41A of the mold 41 is generated based on the first measurement information (measurement result Tm1) and the second measurement information (measurement result Tm2).

In step S1010, it is determined whether the height distribution Tt of the pattern surface 41A of the mold 41 calculated in step S1008 falls within an allowable range. If the height distribution Tt of the pattern surface 41A of the mold 41 does not fall within the allowable range, the process transitions to step S1012, and a notification is given. For example, by issuing an alert from the imprint apparatus 102, the user is notified that the height distribution Tt of the pattern surface 41A of the mold 41 does not fall within the allowable range. On the other hand, if the height distribution Tt of the pattern surface 41A of the mold 41 falls within the allowable range, the process transitions to step S1014, and a notification is given. For example, the user is notified, via a display of the imprint apparatus 102, that the height distribution Tt of the pattern surface 41A of the mold 41 falls within the allowable range.

Thus, according to this embodiment, even if the floating amount of the drive unit 21 fluctuates, it is possible to reduce the influence thereof and measure the height distribution of the pattern surface 41A of the mold 41 with high precision.

Figure 11:
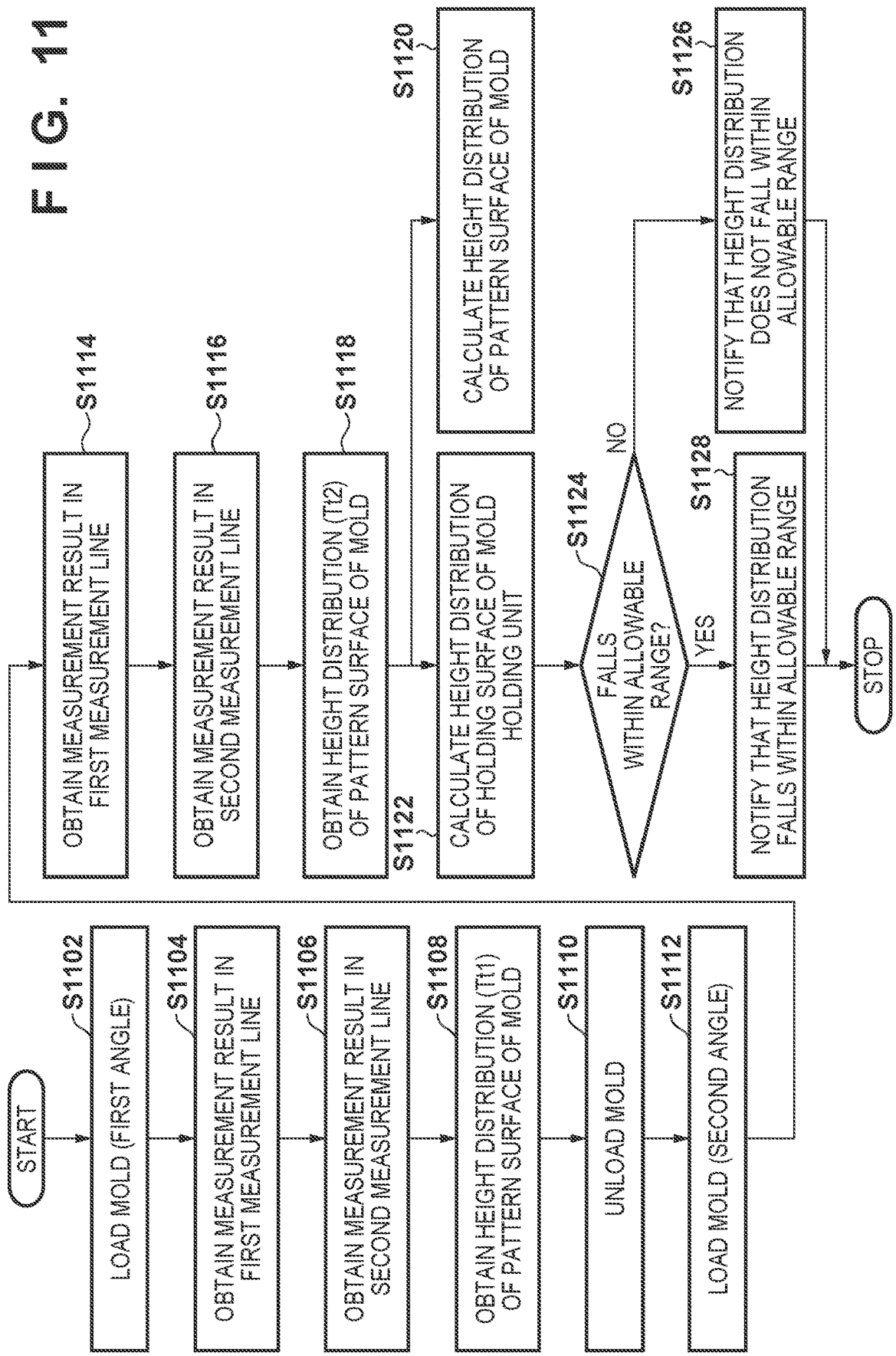
FIG. 11 is a flowchart for describing a measurement method according to the second embodiment.

With reference to FIG. 11, a method of checking the height distribution of the holding surface 51A of the mold holding unit 51 including a measurement method of measuring the height distribution of the holding surface 51A of the mold holding unit 51 in this embodiment will be described. This method is performed by the second control unit 92 comprehensively controlling the respective units of the imprint apparatus 102.

In step S1102, the mold 41 is loaded to the imprint apparatus 102. More specifically, the mold 41 is rotated to a first angle by the rotation mechanism 711 of the mold conveyance unit 71 and, in this state, held by the holding surface 51A of the mold holding unit 51. In other words, the angle of the mold 41 on the holding surface 51A of the mold holding unit 51 is set to the first angle. The first angle is restricted by the structure of the mold holding unit 51 and the mold drive unit 61, and is 0°, 90°, 180°, or 270° in general. In this embodiment, the first angle is 0° as an example.

Since steps S1104, S1106, and S1108 are similar to steps S1004, S1006, and S1008 shown in FIG. 10, respectively, a detailed description thereof will be omitted here. By undergoing steps S1104, S1106, and S1108, the height distribution Tt1 of the pattern surface 41A of the mold 41 in a state in which the angle of the mold 41 on the holding surface 51A of the mold holding unit 51 is set to the first angle is calculated.

In step S1110, the mold 41 is unloaded from the imprint apparatus 102. More specifically, the mold 41 is unloaded from the substrate holding unit 51 (holding surface 51A) to the outside of the imprint apparatus 102 via the mold conveyance unit 71.

In step S1112, the mold 41 is loaded to the imprint apparatus 102. More specifically, the mold 41 is rotated to a second angle by the rotation mechanism 711 of the mold conveyance unit 71 and, in this state, held by the holding surface 51A of the mold holding unit 51. In other words, the angle of the mold 41 on the holding surface 51A of the mold holding unit 51 is set to the second angle. The second angle is only required to be different from the first angle. In this embodiment, the second angle is 90° as an example. Accordingly, the angle difference between the first angle and the second angle is 90° in this embodiment.

Since steps S1114, S1116, and S1118 are similar to steps S1004, S1006, and S1008 shown in FIG. 10, respectively, a detailed description thereof will be omitted here. By undergoing steps S1114, S1116, and S1118, the height distribution Tt2 of the pattern surface 41A of the mold 41 in a state in which the angle of the mold 41 on the holding surface 51A of the mold holding unit 51 is set to the second angle is calculated.

In step S1120, based on the height distribution Tt1 of the pattern surface 41A of the mold 41 calculated in step S1108 and the height distribution Tt2 of the pattern surface 41A of the mold 41 calculated in S1118, the height distribution Tt of the pattern surface 41A of the mold 41 in the state in which it is held by the mold holding unit 51 is calculated. For example, an average of the height distribution Tt1 of the pattern surface 41A of the mold 41 and the height distribution Tt2 of the pattern surface 41A of the mold 41 may be used as the height distribution Tt of the pattern surface 41A of the mold 41. Alternatively, either one of the height distribution Tt1 of the pattern surface 41A of the mold 41 and the height distribution Tt2 of the pattern surface 41A of the mold 41 may be used as the height distribution Tt of the pattern surface 41A of the mold 41.

In step S1122, based on the height distribution Tt1 of the pattern surface 41A of the mold 41 calculated in step S1108 and the height distribution Tt2 of the pattern surface 41A of the mold 41 calculated in S1118, the height distribution of the holding surface 51A of the mold holding unit 51 is calculated. Thus, based on the first measurement information and the second measurement information obtained in steps S1104 and S1106, respectively, and the first measurement information and the second measurement information obtained in steps S1114 and S1116, respectively, distribution information indicating the height distribution of the holding surface 51A is generated.

Here, let Tw_0 be the height distribution of the pattern surface 41A of the mold 41 (pattern surface itself) at the first angle, Tw_90 be the height distribution of the pattern surface 41A of the mold 41 (pattern surface itself) at the second angle, and Tc be the height distribution of the holding surface 51A of the mold holding unit 51. In this case, letting R_90 be the rotation matrix at the time of rotation by 90° around the vertical axis passing through the center of the pattern surface 41A of the mold 41, following equations (11), (12), and (13) hold:

$$Tt1 = Tm\_0 + Tc \quad (11)$$

$$Tt2 = Tm\_90 + Tc \quad (12)$$

$$Tw\_90 = R\_90 \times Tm\_0 \quad (13)$$

From equations (11), (12), and (13), the height distribution Tc of the holding surface 51A of the mold holding unit 51 is expressed by following equation (14). Note that in equation (14), E represents a unit matrix, and R_90' represents an inverse matrix of R_90.

$$Tc = (E - R\_90) \times (Tt1 - R\_90' \times Tt2) \quad (14)$$

In step S1122, by performing calculation processing using the above-described equation, the height distribution Tc of the holding surface 51A of the mold holding unit 51 is calculated.

In step S1124, it is determined whether the height distribution of the holding surface 51A of the mold holding unit 51 calculated in step S1122 falls within an allowable range. If the height distribution of the holding surface 51A of the mold holding unit 51 does not fall within the allowable range, the process transitions to step S1126, and a notification is given. For example, by issuing an alert from the imprint apparatus 102, the user is notified that the height distribution of the holding surface 51A of the mold holding unit 51 does not fall within the allowable range. In the imprint apparatus 102, in accordance with the contents of the alert, cleaning may be performed on the holding surface 51A of the mold holding unit 51 via the mold conveyance unit 71. On the other hand, if the height distribution of the holding surface 51A of the mold holding unit 51 falls within the allowable range, the process transitions to step S1128, and a notification is given. For example, the user is notified, via a display of the imprint apparatus 102, that the height distribution of the holding surface 51A of the mold holding unit 51 falls within the allowable range.

Thus, according to this embodiment, it is possible to measure the height distribution of the holding surface 51A of the mold holding unit 51 with high precision. Note that in this embodiment, a height distribution Tw of the pattern surface 41A of the mold 41 (pattern surface itself) can be also calculated from the above-described equations.

Third Embodiment

Figure 12:
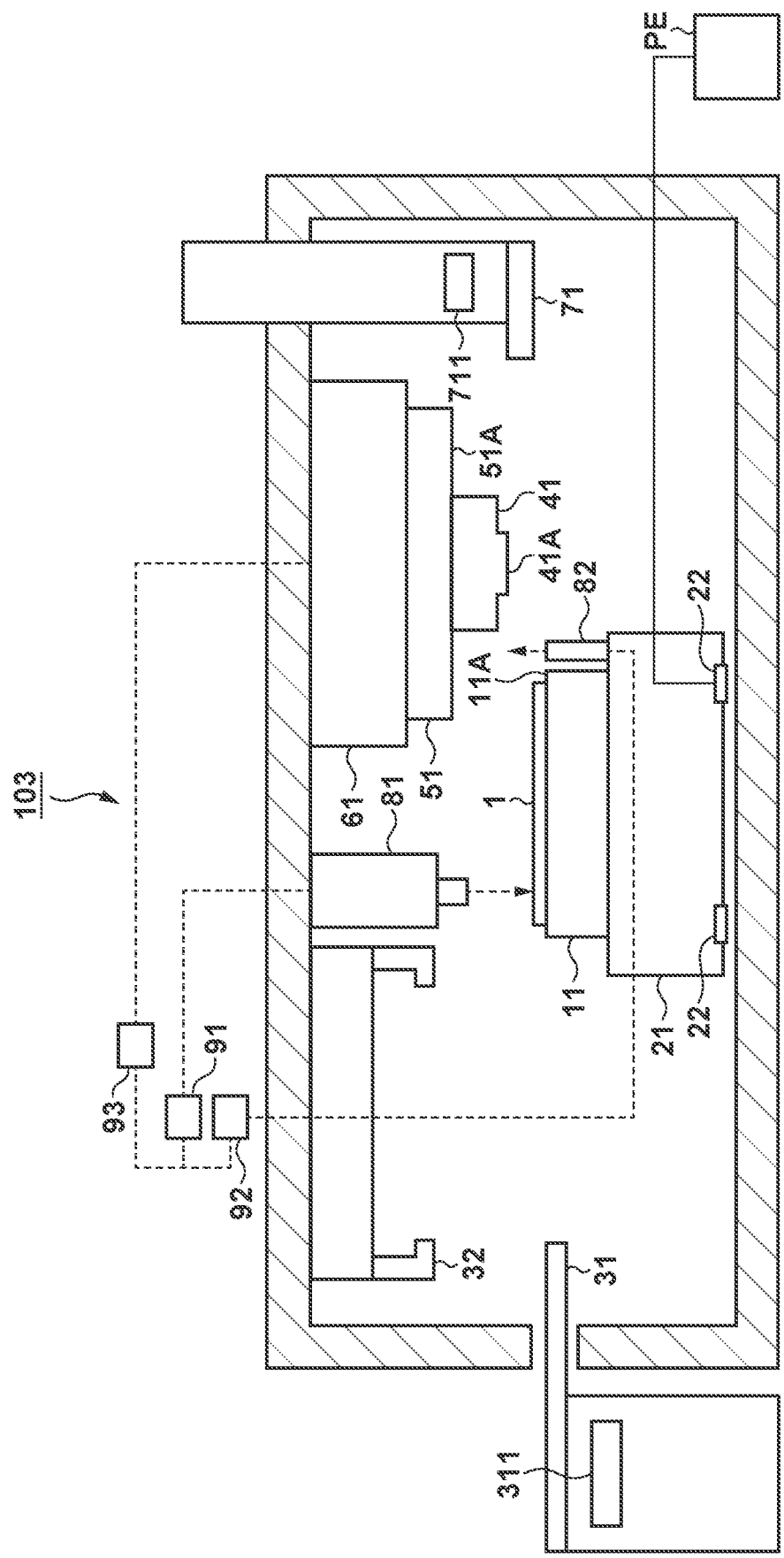
FIG. 12 is a schematic view illustrating configurations of an imprint apparatus according to the third embodiment of the present invention.

FIG. 12 is a schematic view illustrating configurations of an imprint apparatus 103 in the third embodiment of the present invention. The imprint apparatus 103 brings an uncured imprint material supplied onto a substrate into contact with a mold and applies curing energy to the imprint material, thereby forming a pattern of a cured product to which a pattern of the mold has been transferred.

As shown in FIG. 12, the imprint apparatus 103 includes a substrate holding unit 11, a drive unit 21, a substrate conveyance unit 31, a holding unit conveyance unit 32, a mold holding unit 51, a mold drive unit 61, and a mold conveyance unit 71. The imprint apparatus 103 also includes a first measurement unit 81, a second measurement unit 82, a first control unit 91, a second control unit 92, and a main control unit 93.

The main control unit 93 is formed by an information processing apparatus (computer) including a CPU, a memory, and the like, and controls respective units of the imprint apparatus 103 in accordance with programs stored in a storage unit in cooperation with the first control unit 91 and the second control unit 92 or singly. The main control unit 93 controls an imprint process of forming a pattern of an imprint material on a substrate using a mold. For example, based on the height distribution of the surface of a substrate 1 and the height distribution of a pattern surface 41A of a mold 41, the main control unit 93 controls the attitude of at least one of the mold 41 and the substrate 1 such that the pattern surface 41A of the mold 41 and the surface of the substrate 1 become parallel to each other. The attitude of the mold 41 and the attitude of the substrate 1 can controlled via the mold drive unit 61 that drives the mold 41 and the drive unit 21 that drives the substrate 1, respectively. Note that it is also possible to control the attitude of at least one of the mold 41 and the substrate 1 by the first control unit 91 and the second control unit 92.

A series of operations in the imprint apparatus 103, that is, an imprint process will be described. First, the mold 41 is loaded to the imprint apparatus 103 via the mold conveyance unit 71, and the mold 41 is held by a holding surface 51A of the mold holding unit 51. Then, using the measurement method described in the second embodiment, the height distribution of the pattern surface 41A of the mold 41 is measured.

If the measurement of the height distribution of the pattern surface 41A of the mold 41 is completed, the substrate 1 is loaded to the imprint apparatus 103 via the substrate conveyance unit 31, and the substrate 1 is held by a holding surface 11A of the substrate holding unit 11. Then, using the measurement method described in the first embodiment, the height distribution of the surface of the substrate 1 is measured. Note that as for measurement of the height distribution of the surface of the substrate 1, the measurement method may be changed between the first substrate included in a lot and the second and subsequent substrates. For example, for the first substrate, the height distribution of the surface of the substrate 1 is measured with high precision using the measurement method described in the first embodiment. Then, for the second and subsequent substrates, by measuring only several representative points and performing interpolation using the height distribution of the surface of the first substrate, the height distribution of each of the second and subsequent substrates is obtained.

If the height distribution of the surface of the substrate 1 is completed, the drive unit 21 holding the substrate holding unit 11 is driven such that the substrate 1 (shot region thereof) faces the pattern surface 41A of the mold 41 (the substrate 1 is located immediately below the mold 41). For example, the substrate 1 may be supplied with an imprint material in advance using a coater developer or the like provided outside the imprint apparatus 103, or may be supplied with an imprint material using a dispenser (not shown) provided in the imprint apparatus 103.

After making the substrate 1 face the pattern surface 41A of the mold 41, the imprint material on the substrate is brought into contact with the pattern surface 41A of the mold 41 to mold the imprint material on the substrate using the mold 41. At this time, as has been described above, the attitude of at least one of the mold 41 and the substrate 1 is controlled based on the height distribution of the surface of the substrate 1 and the height distribution of the pattern surface 41A of the mold 41 such that the pattern surface 41A of the mold 41 and the surface of the substrate 1 become parallel to each other. Note that the attitude control amount (inclination amount) of each of the mold 41 and the substrate 1 required to make the pattern surface 41A of the mold 41 and the surface of the substrate 1 parallel to each other is different for each shot region of the substrate 1.

After bringing the imprint material on the substrate into contact with the pattern surface 41A of the mold 41, the imprint material on the substrate is irradiated with light such as ultraviolet light via the mold 41 to cure the imprint material. Then, by releasing the mold 41 from the cured imprint material on the substrate, a pattern of the imprint material on the substrate is formed.

After performing such an imprint process on all the shot regions of the substrate 1, the substrate 1 is unloaded from the substrate holding unit 11 (holding surface 11A) to the outside of the imprint apparatus 103 via the substrate conveyance unit 31.

Figure 13:
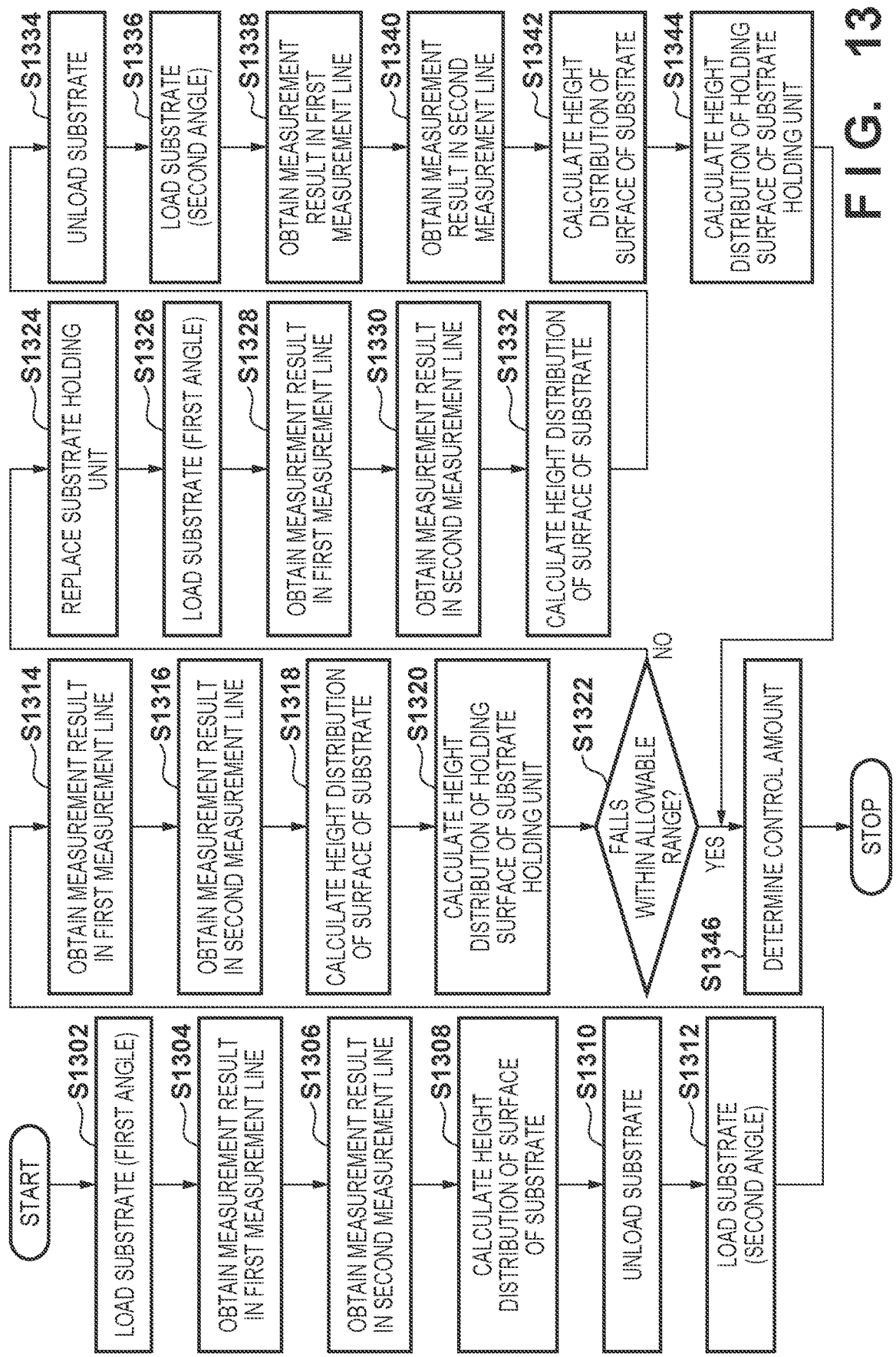
FIG. 13 is a flowchart for describing a method of replacing a substrate holding unit of the imprint apparatus shown in FIG. 12.

With reference to FIG. 13, a method of replacing the substrate holding unit 11 of the imprint apparatus 103 will be described. In the substrate holding unit 11, by repeating the imprint process, a foreign substance may adhere to the holding surface 11A or wearing (scratching) may occur. Therefore, as for the substrate holding unit 11, it is preferable to periodically measure the height distribution of the holding surface 11A to determine whether to replace the substrate holding unit 11.

First, in steps S1302, S1304, S1306, S1308, S1310, S1312, S1314, S1316, S1318, and S1320, the height distribution of the holding surface 11A of the substrate holding unit 11 is calculated. Since steps S1302, S1304, S1306, S1308, S1310, S1312, S1314, S1316, S1318, and S1320 are similar to steps S704, S706, S708, S710, S712, S714, S716, S718, and S722 shown in FIG. 7, respectively, a detailed description thereof will be omitted here.

In step S1322, it is determined whether the height distribution of the holding surface 11A of the substrate holding unit 11 calculated in step S1320 falls within an allowable range. If the height distribution of the holding surface 11A of the substrate holding unit 11 does not fall within the allowable range, the process transitions to step S1324. On the other hand, if the height distribution of the holding surface 11A of the substrate holding unit 11 falls within the allowable range, the process transitions to step S1346.

In step S1324, the substrate holding unit 11 is replaced. More specifically, the substrate holding unit 11 in which the height distribution of the holding surface 11A does not fall within the allowable range is unloaded from the drive unit 21 to the outside of the imprint apparatus 103 via the holding unit conveyance unit 32, and the new substrate holding unit 11 is held by the drive unit 21. Note that the substrate holding unit 11 that needs to be replaced may be limited to one that cannot be expected to recover even by cleaning or the like.

In steps S1326, S1328, S1330, S1332, S1334, S1336, S1338, S1340, S1342, and S1344, the height distribution of the holding surface 11A of the new substrate holding unit 11 is calculated. Since steps S1326, S1328, S1330, S1332, S1334, S1336, S1338, S1340, S1342, and S1344 are similar to steps S704, S706, S708, S710, S712, S714, S716, S718, and S722 shown in FIG. 7, respectively, a detailed description thereof will be omitted here.

In step S1346, in a case in which the new substrate holding unit 11 is used, the attitude control amount (inclination amount) of each of the mold 41 and the substrate 1 required to make the pattern surface 41A of the mold 41 and the surface the substrate 1 parallel to each other is determined. More specifically, the height distribution of the holding surface 11A of the substrate holding unit 11 calculated in step S1320 is compared with the height distribution of the holding surface 11A of the new substrate holding unit 11 calculated in step S1344, and the difference therebetween is reflected on the previous control amount.

Fourth Embodiment

The pattern of a cured product formed using the imprint apparatus 101, 102, or 103 is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

Figure 14A:
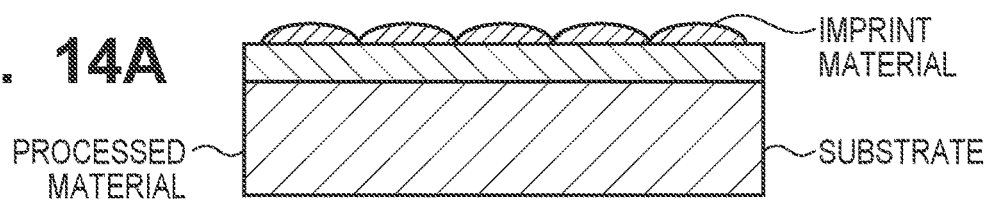
FIGS. 14A to 14F are views for describing an article manufacturing method.

Next, description regarding a detailed method of manufacturing an article is given. As illustrated in FIG. 14A, the substrate such as a silicon wafer with a processed material such as an insulator formed on the surface is prepared. Next, an imprint material is applied to the surface of the processed material by an inkjet method or the like. A state in which the imprint material is applied as a plurality of droplets onto the substrate is shown here.

Figure 14B:
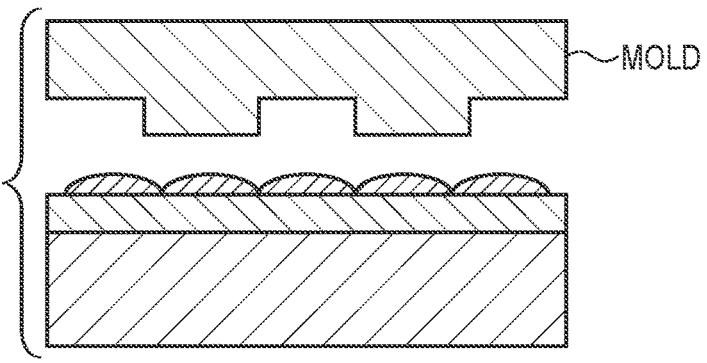
Figure 14C:
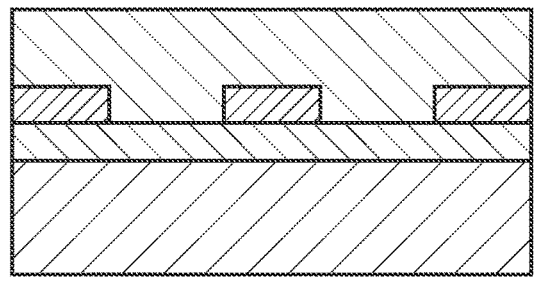

As shown in FIG. 14B, a side of the mold for imprint with a projection and groove pattern formed is directed to and caused to face the imprint material on the substrate. As illustrated in FIG. 14C, the substrate to which the imprint material is applied is brought into contact with the mold, and a pressure is applied. The gap between the mold and the processed material is filled with the imprint material. In this state, when the imprint material is irradiated with light serving as curing energy through the mold, the imprint material is cured.

Figure 14D:
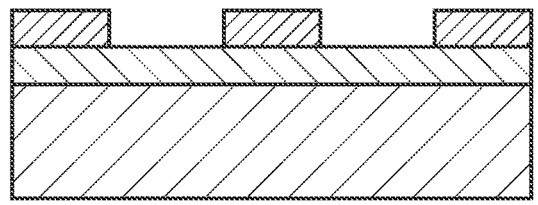

As shown in FIG. 14D, after the imprint material is cured, the mold is released from the substrate. Thus, the pattern of the cured product of the imprint material is formed on the substrate. In the pattern of the cured product, the groove of the mold corresponds to the projection of the cured product, and the projection of the mold corresponds to the groove of the cured product. That is, the projection and groove pattern of the mold is transferred to the imprint material.

Figure 14E:
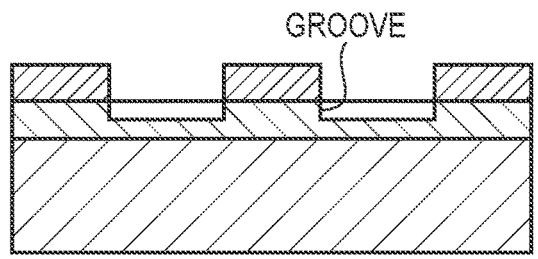
Figure 14F:
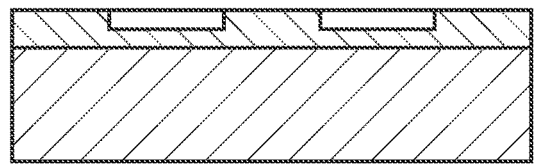

As shown in FIG. 14E, when etching is performed using the pattern of the cured product as an etching resistant mask, a portion of the surface of the processed material where the cured product does not exist or remains thin is removed to form a groove. As shown in FIG. 14F, when the pattern of the cured product is removed, an article with the grooves formed in the surface of the processed material can be obtained. The pattern of the cured product is removed here, but, for example, the pattern may be used as a film for insulation between layers included in a semiconductor element or the like without being removed after processing, in other words as a constituent member of the article.

The present invention is not limited to the above embodiments and various changes and modifications can be made within the spirit and scope of the present invention. Therefore, to apprise the public of the scope of the present invention, the following claims are made.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2020-071199 filed on Apr. 10, 2020, which is hereby incorporated by reference herein in its entirety.

What is claimed is:

1. An imprint apparatus that forms a pattern of an imprint material on a substrate using a mold, the apparatus comprising:
a holding unit including a holding surface configured to hold the substrate;
a drive unit configured to drive the holding unit in a floating state;
a measurement unit configured to measure a height of a pattern surface of the mold or a height of the substrate held by the holding surface; and
a control unit configured to perform processing of controlling an attitude of at least one of the mold and the substrate such that the pattern surface of the mold and a surface of the substrate become parallel to each other, wherein the processing comprises:
while relatively driving the measurement unit with respect to a measurement target region of the pattern surface of the mold or the surface of the substrate in a first direction by the drive unit, obtaining first measurement information indicating a height of the pattern surface of the mold or a height of the surface of the substrate in each of a plurality of first measurement lines parallel to the first direction and different from each other by measuring each of the plurality of first measurement lines by the measurement unit,
while driving the measurement unit with respect to the measurement target region of the pattern surface of the mold or the surface of the substrate in a second direction crossing all of the plurality of first measurement lines by the drive unit, obtaining second measurement information indicating a height of the pattern surface of the mold or a height of the surface of the substrate in one second measurement line parallel to the second direction by measuring the second measurement line by the measurement unit,
generating first distribution information indicating a height distribution of the pattern surface of the mold or a height distribution of the surface of the substrate based on the first measurement information and the second measurement information, and
generating second distribution information indicating a height distribution of the holding surface configured to hold the substrate based on the first measurement information and the second measurement information obtained in the obtaining the first measurement information and in the obtaining the second measurement information, respectively, in a state in which an angle of the substrate around a vertical axis of the substrate on the holding surface is set to a first angle, and the first measurement information and the second measurement information obtained in the obtaining the first measurement information and in the obtaining the second measurement information, respectively, in a state in which the angle of the substrate around the vertical axis of the substrate on the holding surface is set to a second angle different from the first angle.

2. The imprint apparatus according to claim 1, wherein
a plurality of first measurement points to be measured by the measurement unit are set in each of the plurality of first measurement lines,
a plurality of second measurement points to be measured by the measurement unit are set in the second measurement line, and
the plurality of first measurement points and the plurality of second measurement points are set such that, for each of the plurality of first measurement lines, one measurement point of the plurality of first measurement points overlaps one measurement point of the plurality of second measurement points.

3. The imprint apparatus according to claim 1, wherein the first direction and the second direction are orthogonal to each other.

4. The imprint apparatus according to claim 3, wherein the drive unit includes two guides parallel to two directions orthogonal to each other,
the first direction is a direction parallel to one guide of the two guides, and
the second direction is a direction parallel to the other guide of the two guides.

5. The imprint apparatus according to claim 1, wherein an angle difference between the first angle and the second angle is one of 90° and 180°.

6. The imprint apparatus according to claim 1, wherein the measurement target region is an entire region of the surface of the substrate.

7. The imprint apparatus according to claim 1, wherein the measurement target region is a partial region of the surface of the substrate.

8. An article manufacturing method comprising:
forming a pattern on a substrate using an imprint apparatus defined in claim 1;
processing the substrate on which the pattern is formed in the forming; and
manufacturing an article from the processed substrate.

9. An imprint apparatus that forms a pattern of an imprint material on a substrate using a mold, the apparatus comprising:
a first holding unit including a first holding surface configured to hold the substrate;
a second holding unit including a second holding surface configured to hold the mold;
a drive unit configured to drive the first holding unit in a floating state;
a measurement unit provided in the drive unit and configured to measure a height of a pattern surface of the mold; and
a control unit configured to perform processing of controlling an attitude of at least one of the mold and the substrate such that the pattern surface of the mold and a surface of the substrate become parallel to each other, wherein the processing comprises:
while driving the measurement unit in a first direction with respect to the pattern surface of the mold by the drive unit, obtaining first measurement information indicating a height of the pattern surface of the mold in each of a plurality of first measurement lines parallel to the first direction and different from each other by measuring each of the plurality of first measurement lines by the measurement unit,
while driving the measurement unit with respect to the pattern surface of the mold in a second direction crossing all of the plurality of first measurement lines by the drive unit, obtaining second measurement information indicating a height of the pattern surface of the mold in one second measurement line parallel to the second direction by measuring the second measurement line by the measurement unit,
generating first distribution information indicating a height distribution of the pattern surface of the mold based on the first measurement information and the second measurement information, and
generating second distribution information indicating a height distribution of the second holding surface configured to hold the mold based on the first measurement information and the second measurement information obtained in the obtaining the first measurement information and in the obtaining the second measurement information, respectively, in a state in which an angle of the mold around a vertical axis of the mold on the second holding surface is set to a first angle, and the first measurement information and the second measurement information obtained in the obtaining the first measurement information and in the obtaining the second measurement information, respectively, in a state in which the angle of the mold around the vertical axis of the mold on the second holding surface is set to a second angle different from the first angle.

10. An article manufacturing method comprising:
forming a pattern on a substrate using an imprint apparatus defined in claim 9;
processing the substrate on which the pattern is formed in the forming; and
manufacturing an article from the processed substrate.

* * * * *